United States Patent [19]

Shinohara

[11] Patent Number: 5,089,992
[45] Date of Patent: Feb. 18, 1992

[54] SEMICONDUCTOR MEMORY DEVICE AND A DATA PATH USING THE SAME

[75] Inventor: Hirofumi Shinohara, Hyogo, Japan

[73] Assignee: Mitsubishi Denki Kabushiki Kaisha, Tokyo, Japan

[21] Appl. No.: 315,377

[22] Filed: Feb. 24, 1989

[30] Foreign Application Priority Data

Jun. 30, 1988 [JP] Japan .................. 63-165647

[51] Int. Cl.⁵ .......... G11C 7/00; G11C 5/02; G11C 5/06
[52] U.S. Cl. .................. 365/51; 365/63; 365/189.04; 365/230.04; 365/230.05
[58] Field of Search ............ 365/230.05, 230.04, 365/230.03, 51, 63, 69, 189.08, 189.04, 208, 210

[56] References Cited

U.S. PATENT DOCUMENTS

| | | | |
|---|---|---|---|
| 4,287,575 | 9/1981 | Eardley et al. | 365/174 |
| 4,571,703 | 2/1986 | Noda | 365/154 |
| 4,613,958 | 9/1986 | Culican et al. | 365/189.08 |
| 4,706,219 | 11/1987 | Miyata et al. | 365/189.08 |
| 4,791,607 | 12/1988 | Igarashi et al. | 365/189,08 X |
| 4,833,651 | 5/1989 | Seltzer et al. | 365/230.05 X |
| 4,910,712 | 3/1990 | Camarota et al. | 365/189.08 |
| 4,924,440 | 5/1990 | Tanoi | 365/189.08 |
| 4,935,896 | 6/1990 | Matsumura | 365/187 |

FOREIGN PATENT DOCUMENTS

| | | | |
|---|---|---|---|
| 0167281 | 1/1986 | European Pat. Off. | 365/69 |
| 3827287 | 6/1989 | Fed. Rep. of Germany | |
| 63-104297 | 5/1988 | Japan | 365/69 |
| 63-108593 | 5/1988 | Japan | 365/69 |

OTHER PUBLICATIONS

O'Connor, "The Twin-Port Memory Cell", IEEE Journal of Solid-State Circuits, vol. SC-22, No. 5, Oct. 1987.

T. Chan et al "Advanced Structure Arrays Combine High Density Memories with Channel-Free Logic Array" IEEE 1987 Custom Integrated Circuits Conference.

"The AM2900 Family Data Book with Related Support Circuits" Advanced Micro Devices, Inc. (1979).

*Primary Examiner*—Alyssa H. Bowler
*Attorney, Agent, or Firm*—Lowe, Price, LeBlanc & Becker

[57] ABSTRACT

A semiconductor memory device has multiple ports for enabling writing and reading of data simultaneously. A memory cell array comprises a plurality of memory cells (1) arranged in rows and in columns, write and read word lines (WW, RW) being connected to the memory cells of the respective rows and write and read bit lines (WB, RB) being connected to the memory cells of the respective columns. Data is inputted to the write bit lines (WB) from an input terminal (DI) through a write circuit (3i) and data read out form the corresponding memory cells are outputted to an output terminal (DO) through a sense amplifier (4i). A first port is formed by the write word line, the write bit line and the input terminal, while a second part is formed by the read word line, the read bit line and the output terminal.

21 Claims, 22 Drawing Sheets

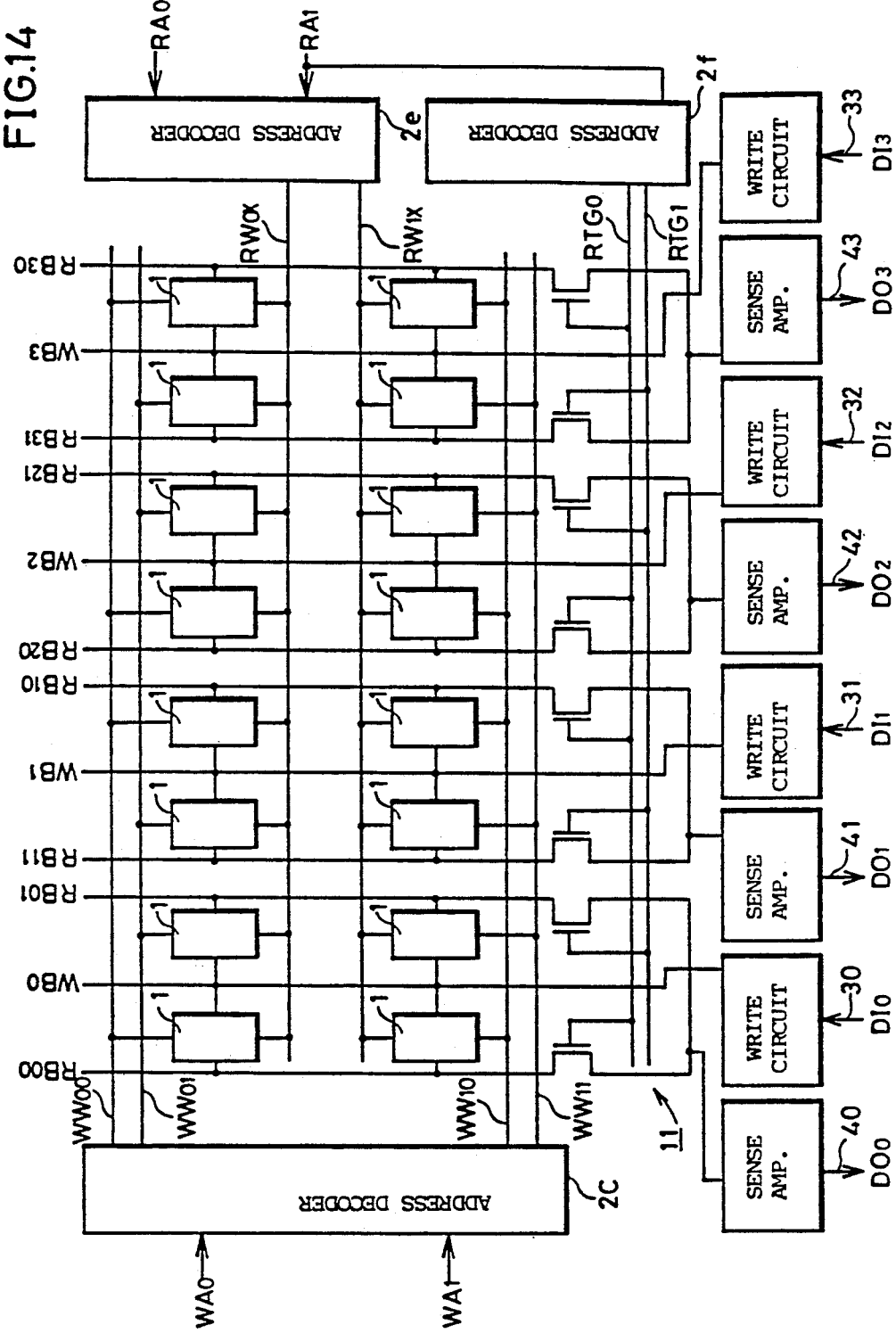

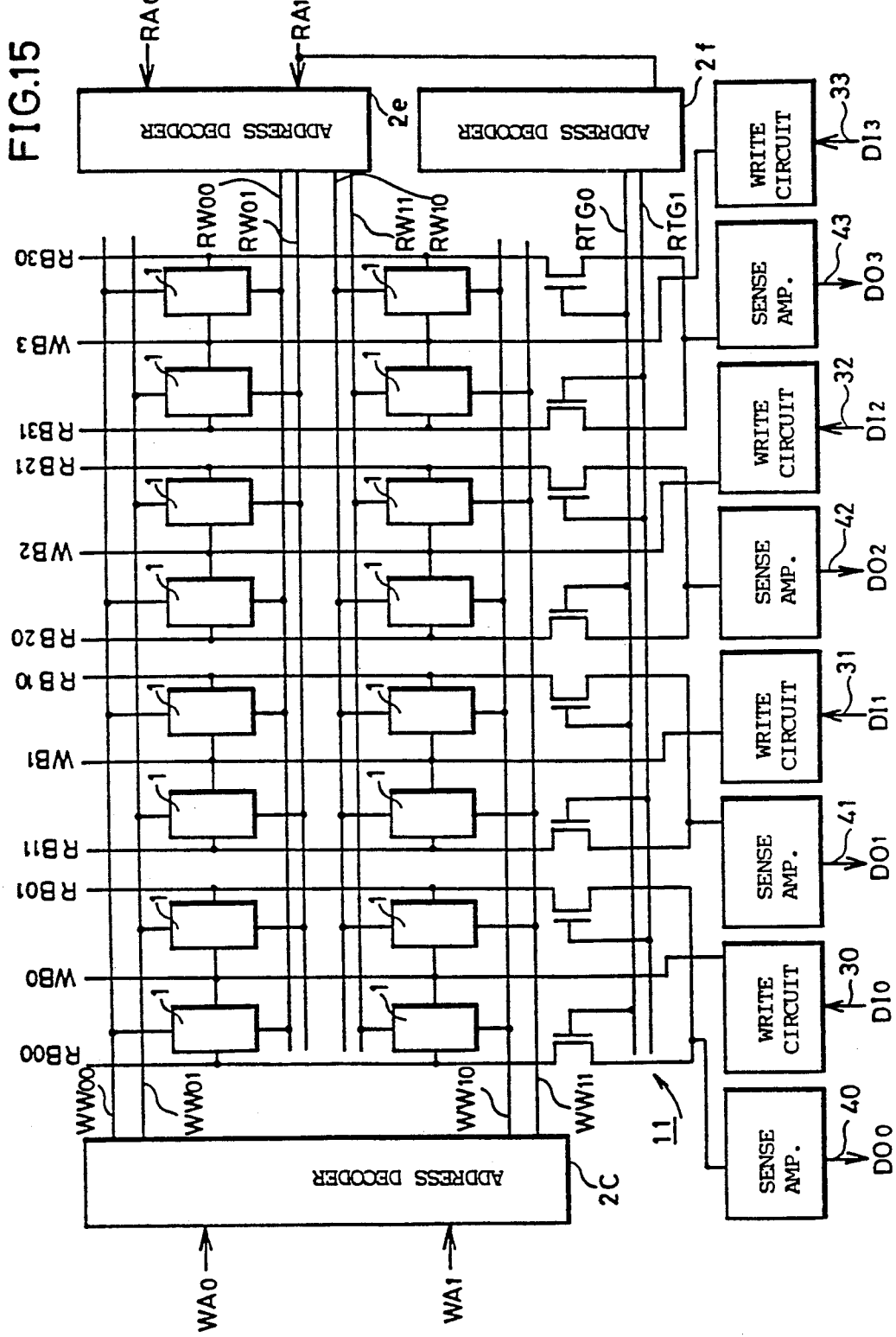

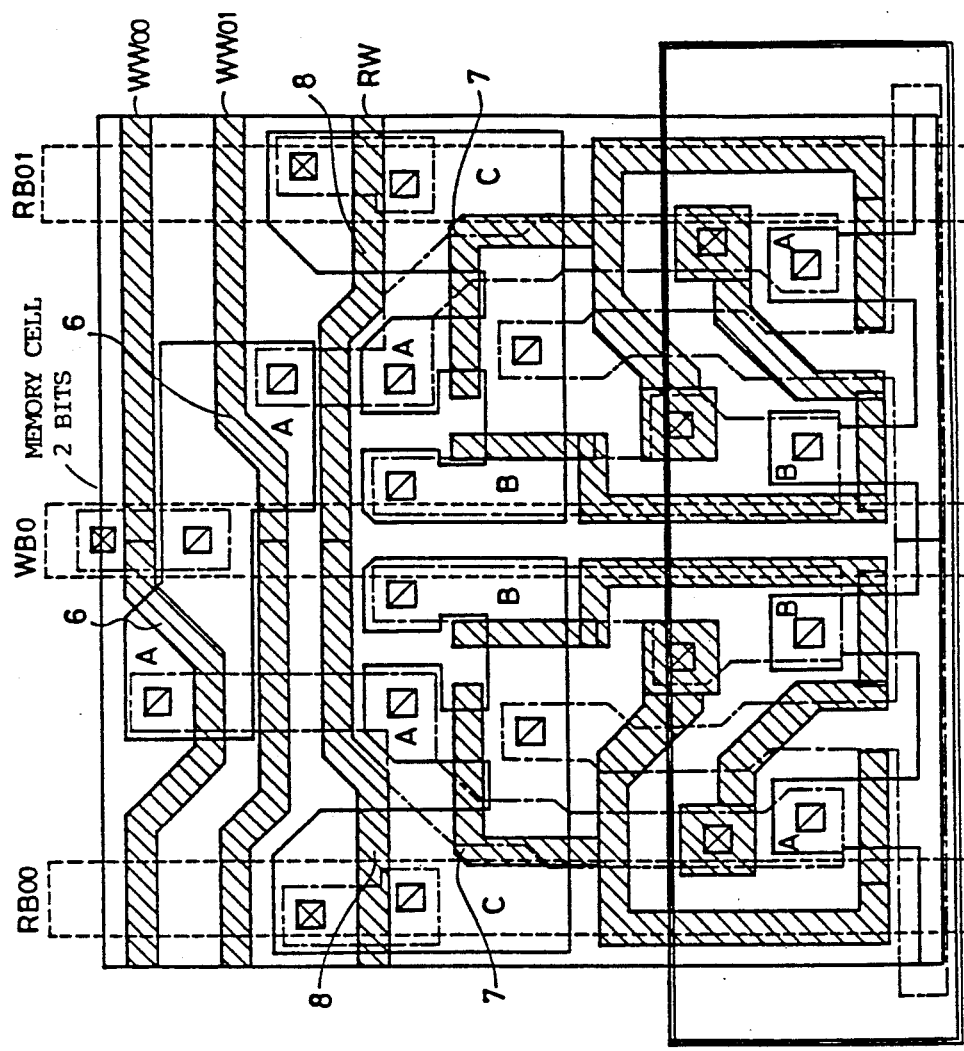
FIG.17
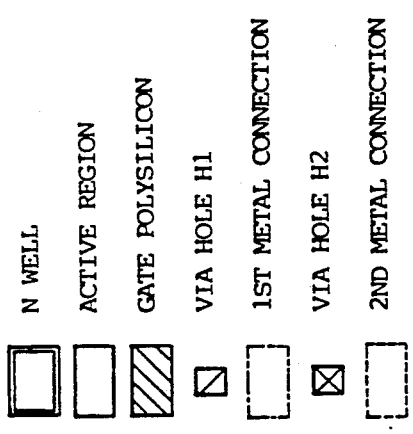
- N WELL
- ACTIVE REGION
- GATE POLYSILICON
- VIA HOLE H1
- 1ST METAL CONNECTION
- VIA HOLE H2
- 2ND METAL CONNECTION

SEMICONDUCTOR MEMORY DEVICE AND A DATA PATH USING THE SAME

BACKGROUND OF THE INVENTION

1. Field of the Invention

The present invention relates to semiconductor memory devices and data paths using the same. More particularly, the present invention relates to a semiconductor memory device such as a multiport memory capable of writing data simultaneously from a multiport (i.e., multiple ports) into an array of memory cells or reading the data therefrom, and a data path using such a multiport memory.

2. Description of the Prior Art

FIG. 25 is a block diagram showing memory cells of a conventional multiport memory of a 4-word×4-bit configuration as well as peripheral circuits thereof.

Referring to FIG. 25, the memory cells 1 store data therein and those memory cells are arrayed in four rows and four columns to constitute a memory cell array. Address decoders 2a and 2b are provided to address each memory cell 1. The address decoder 2a receives write address signals WA0 and WA1 and output terminals of the address decoder 2a are connected with write word lines WW0 to WW3. The write word lines WW0 to WW3 are connected to the corresponding memory cells 1 arrayed in the row direction.

The address decoder 2b receives bit address signals RA0 and RA1 and it has output terminals connected to read word lines RW0 to RW3. Those read word lines RW0 to RW3 are connected to the corresponding memory cells 1 arrayed in the row direction. The memory cells 1 arrayed in the column direction are connected to write bit lines WB0 to WB3 and read bit lines RB0 to RB3. The write bit lines WB0 to WB3 are connected to output terminals of write circuits 30 to 33, and input terminals of the write circuits 30 to 33 receive data $DI_0$ to $DI_3$. The read bit lines RB0 to RB3 are connected to input terminals of sense amplifiers 40 to 43, which output read data $DO_0$ to $DO_3$.

The write address signals WA0 and WA1, the write word lines WW0 to WW3, the write bit lines WB0 to WB3, the address decoder 2a and the write circuits 30 to 33 constitute write ports, while the read address signals RA0 and RA1, the read word lines RW0 to RW3, the read bit lines RB0 to RB3, the address decoder 2b and the sense amplifiers 40 to 43 constitute read ports.

FIG. 26 is an electric circuit diagram of a memory cell shown in FIG. 25.

Referring to FIG. 26, inverters 5a and 5b have a cross connection of input and output terminals A and B, to constitute a flip-flop, the terminal A being connected to a write bit line WB through an access gate 6 formed by an N channel MOS transistor. The access gate 6 has a gate connected to a write word line WW. The terminal B is connected to a transmission inverter 7, which has an output terminal C connected to a read bit line RB through an access gate 8 formed by an N channel MOS transistor. The access gate 8 has a gate connected to a read word line RW. As can be seen from FIG. 26, only one write bit line WB is connected for one port of each memory cell 1.

FIG. 27 is an electric circuit diagram showing an example of a write circuit. In FIG. 27, the write circuit 30 comprises two inverters 30a and 30b connected in series. The other write circuits 31 to 33 are formed in the same manner as in the write circuit 30.

FIG. 28 is an electric circuit diagram showing an example of a sense amplifier. In FIG. 28, the sense amplifier 40 comprises two inverters 40b and 40c connected in series and it has an input pull-up gate 40a connected on the input side of the inverter 40b. The other sense amplifiers 41 to 43 are formed in the same manner as in the sense amplifier 40.

FIG. 29 shows another example of a sense amplifier, which is a current sense type.

Referring now to FIGS. 25 to 29, write operation of the conventional multiport memory will be described. The data $DI_0$ to $DI_3$ to be written are supplied to the write circuits 30 to 33. The write circuits 30 to 33 set the write bit lines WB0 to WB3 to "1" or "0" according to the data $DI_0$ to $DI_3$. Words to be written out of the four words of the memory cell array are addressed by the write address signals WA0 and WA1. More specifically, the address decoder 2a decodes the write address signals WA0 and WA1 and sets any one of the write word lines WW0 to WW3 to "1" and the other three lines to "0" in response to the write address signals WA0 and WA1. The access gate 6 of the memory cell 1 connected to the write word line WW at "1" is conducted, whereby the write bit line WB and the terminal A are electrically connected. A sum of an output resistance of the write circuits 30 and an on resistance of the access gate 6 is set lower than an output resistance of the inverter 5b. Thus, when the access gate 6 is conducted, the value of the terminal B becomes equal to that of the write bit line WB designated by the data DI irrespective of the initial values of the terminals A and B. In consequence, the data is written.

When the write word line WW is set to "0", the write bit line WB and the terminal A are electrically disconnected and the values of the terminals A and B immediately before the change of the write word line WW from "1" to "0" are maintained by the flip-flop including the inverters 5a and 5b. Accordingly, due to the action of the address decoder 2a, correct data is not written in the memory cell 1 connected to the write word line WW set to "0".

Next, data read operation will be described. Reading of data in the multiport memory is performed by means of the read ports. More specifically, words to be read out of the four words are designated by the read address signals RA0 and RA1. The address decoder 2b decodes the read address signals RA0 and RA1 and sets only any one of the read word lines RW0 to RW3 to "1" and the other three lines to "0" according to the combination of those read address signals RA0 and RA1. The access gate 8 of the memory cell 1 connected to the read word line RW set to "1" is conducted, whereby the value of the terminal B is inverted by the transmission inverter 7 and the access gate 8, to set the read bit line RB at the value of the terminal A.

The values of the read bit lines RB0 to RB3 are detected and amplified by the sense amplifiers 40 to 43 and those amplified values are outputted as the data $DO_0$ to $DO_3$. Since an input impedance viewed from the side of the terminal B of the transmission inverter 7 is extremely high, the initial value of each read bit line RB is never transmitted to the corresponding terminal B through the corresponding terminal C. Accordingly, the values of the terminals A and B maintained in the flip-flop including the inverters 5a and 5b are never inverted by read operation.

Since the conventional multiport memory is thus constructed, when a write word line WW is set to "1", data are written in all the memory cells 1 of the corresponding row in the memory cell array. Therefore, it is necessary to establish a one-to-one correspondence between one row and one word and between one column and one bit. In consequence, a proportion of the memory cell array cannot be set freely and a distance between a write circuit and a sense amplifier located corresponding to one bit is narrow, which involves difficulties in layout and causes an increase in an area of the device because of increase of the height of the device. In addition, in a multiport memory having a large number of words, a bit line length is increased which involves disadvantages such as increases in delay time and charge and discharge currents.

SUMMARY OF THE INVENTION

Therefore, a primary object of the present invention is to provide a semiconductor memory device which makes it possible for one row of a memory cell array to correspond to n words and for n columns to correspond to one bit.

Another object of the present invention is to provide a semiconductor memory device having a multiport including a write port and a read port, making it possible for one row of a memory cell array to correspond to n words and for n columns to correspond to one bit.

A further object of the present invention is to provide a data path which can be constructed relatively easily by using a semiconductor memory device having a multiport.

Briefly stated, according to a first aspect of the invention, a memory cell array comprises a plurality of memory cells including data storage nodes, arranged in a plurality of rows and a plurality of columns. Write word lines and read word lines are connected to the memory cells of the respective rows of the memory cell array and write bit lines and read bit lines are connected to the memory cells of the respective columns of the memory cell array. Data for enabling the write bit lines are inputted from input terminals and the data read out from the memory cells are outputted through output terminals. Electric connection between a write bit line and a data storage node of a memory cell connected to the write bit line is controlled in response to a signal outputted to a write word line, whereby a first port is formed by the write bit line, the write word line and the input terminal. On the other hand, a read word line is enabled so that the corresponding bit line is enabled by data corresponding to a value of a data storage node of the corresponding memory cell, and data corresponding to a signal of a write bit line is outputted at an output terminal, whereby a second port is formed by the read bit line, the read word line and the output terminal. The number of write word lines provided is at least two corresponding to the memory cells of each row of the memory cell array. The two write word lines are connected to one memory cell and the other memory cell of the respective adjacent two memory cells of the same row.

Consequently, according to the first aspect of the invention, a ratio of two dimensions of layout of a memory cell array can be set freely and the number of rows can be decreased. In addition, the number of columns for one bit can be increased and the peripheral circuits such as write circuits or sense amplifiers can be arranged easily. Furthermore, the write bit lines and the read bit lines can be shortened, making it possible to reduce delay time required for charge and discharge of those bit lines and to reduce consumption of power.

According to a second aspect of the invention, a semiconductor memory device comprises a memory cell array, write word lines, read word lines, write bit lines, read bit lines, input terminals and output terminals, in the same manner as in the device according to the first aspect. A first port is formed by a write bit line, a write word line and an input terminal and a second port is formed by a read bit line, a read word line and an output terminal. A plurality of pairs of write word lines are provided for the memory cells of the respective rows of the memory cell array, the write word lines of each pair being provided to cross each other, and each memory cell being connected to only one of the write word lines of the corresponding pair.

Consequently, the same effect as in the invention of the first aspect can be also obtained in the invention of the second aspect.

According to a third aspect of the invention, a semiconductor memory device has data storage nodes and a memory cell array of this device is formed by a plurality of rows and a plurality of columns of memory cells each storing data of one bit, word lines being connected to the memory cells of the respective rows of the memory cell array and bit lines being connected to the memory cells of the respective columns of the array. Electric connection between a data storage node of a memory cell and a bit line is controlled in response to a signal applied to a word line. A plurality of pairs of word lines are provided for the respective memory cells and electric connection of each memory cell is controlled in response to a signal of one word line of the corresponding pair. The respective adjacent two memory cells of the same row are controlled by different word lines of the same pair and the bit lines are connected in common with those adjacent memory cells.

Consequently, according to the third aspect of the invention, a plurality of word lines are provided corresponding to the memory cells of one row and a bit line is used in common. Accordingly, the number of bit lines can be decreased and as a result the area of the device can be reduced. Thus, a semiconductor memory device can be obtained with a high yield.

The invention according to a fourth aspect comprises a data path including first and second ports and using a semiconductor memory device of a 1-bit n-word type. Memory cells of n words including data storage nodes are arranged in a plurality of rows and a plurality of columns to form a memory cell array. Write word lines and read word lines are connected to the memory cells of the respective rows of the memory cell array. Write bit lines and read bit lines are connected to the memory cells of the respective columns of the memory cell array. Inputted data is written in any of the plurality of memory cells by write means. The write means, the corresponding word line and the corresponding bit line constitute a first port. The data read out from any of the memory cells is amplified by amplifier means. The amplifier means and the corresponding read word line and the corresponding read bit line constitute a second port. The data outputted from the amplifier means is supplied to arithmetic and logic means of a 1-bit configuration, where arithmetic processing is performed.

Consequently, according to the fourth aspect of the invention, a data path can be easily arranged by using a semiconductor memory device having multiple ports and the area required for the data path can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 14, 15 and 16 are concrete block diagrams showing still further embodiments of the present invention.

FIG. 17 is an illustration of layout of memory cells for two bits shown in any of FIGS. 14 to 16.

FIGS. 23 and 24 are diagrams showing data of one bit width in an enlarged manner.

DESCRIPTION OF THE PREFERRED EMBODIMENTS

Figure 1:
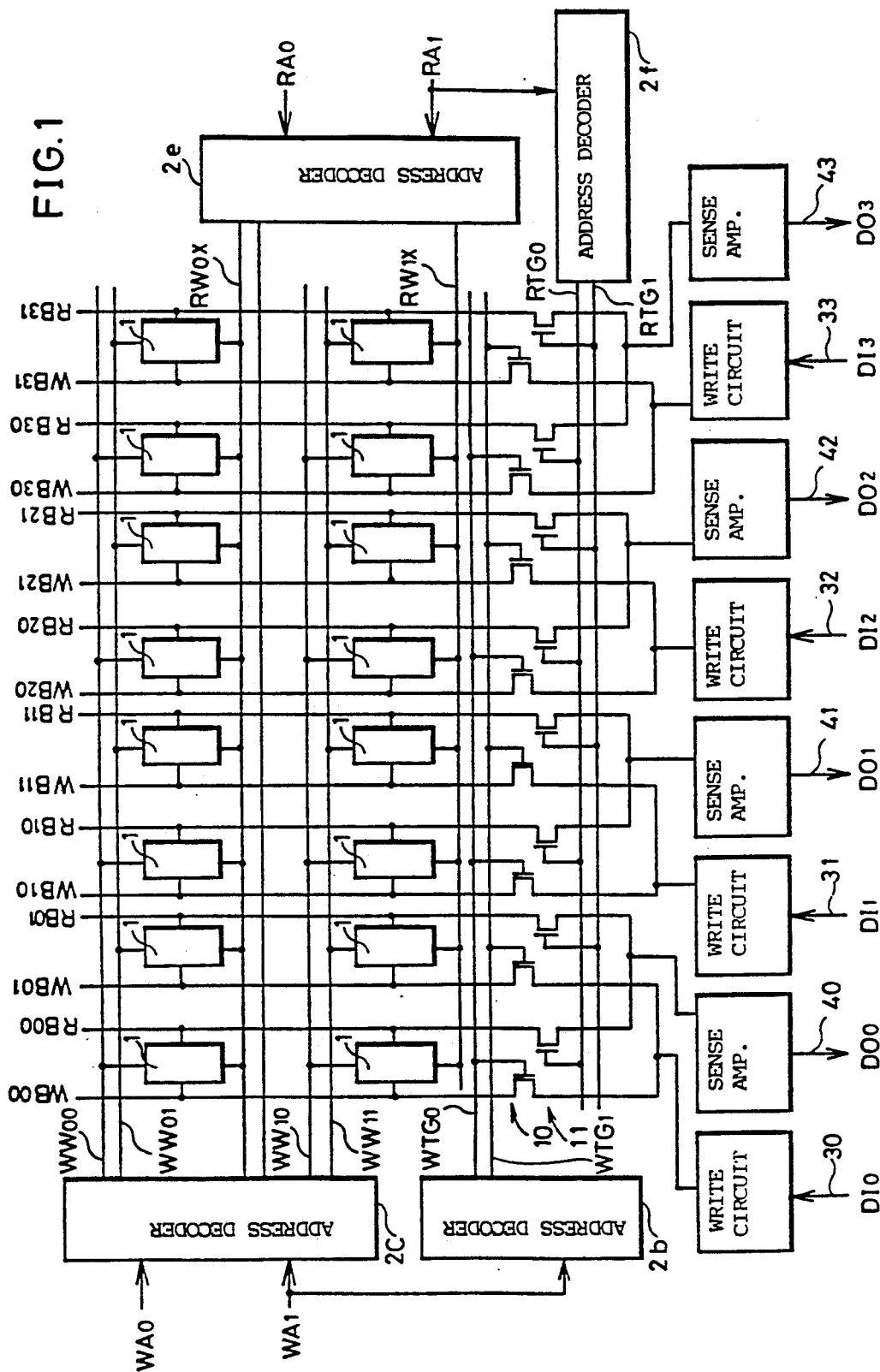
FIG. 1 is a concrete block diagram of an embodiment of the present invention.

FIG. 1 is a concrete block diagram of an embodiment of the present invention.

The embodiment shown in FIG. 1 is a multiport memory of a 4-word 4-bit configuration, in the case of $n=2$, which allows one row of memory cells to correspond to two words and allows two columns to correspond to one bit, including two ports, i.e., a write port and a read port. Memory cells 1 are arranged in two rows and eight columns to form a memory cell array. First, construction of the write port will be described.

The write word lines WW00 and WW01 form a pair, which corresponds to a first row and extends along the row. The write word line WW10 and WW11 also form a pair, which corresponds to a second row and extends along the row. Those write word lines WW00 to WW11 are connected to an address decoder 2c to which write address signals WA0 and WA1 are inputted. Each memory cell 1 is connected to one of the write word lines of the corresponding pair. More specifically, the respective memory cells 1 of the upper row are connected alternately to the write word lines WW00 and WW01 and the respective memory cells 1 of the lower row are connected alternately to the write word lines WW10 and WW11.

Pairs of write bit lines WB00-WB01, WB10-WB11, WB20-WB21 and WB30-WB31 corresponding to the respective write word lines WW00-WW01 and WW10-WW11 are connected to output terminals of write circuits 30, 31, 32 and 33 common to the respective pairs through a selector 10 formed by a plurality of N channel MOS transistors. Data $DI_0$ to $DI_3$ are supplied to those write circuits 30 to 33, respectively. The selector 10 is controlled by control signals WTG0 and WTG1 of an address decoder 2d. A write address signal WA1 is supplied to the address decoder 2d.

Next, the read port will be described. Read word lines RW0X and RW1X are provided corresponding to the respective rows of the memory cell array and the read word lines RW0X and RW1X are connected to an address decoder 2e. A read address signal RA0 is inputted to the address decoder 2e. The read word line RW0X is connected to all the eight memory cells 1 of the upper row and the read word line RW1X is connected to all the eight memory cells 1 of the lower row. Read bit lines RB00-RB01, RB10-RB11, RB20-RB21 and RB30-RB31 constitute four pairs, which are connected to input terminals of sense amplifiers 40, 41, 42 and 43, respectively, through a selector 11 formed by a plurality of N channel MOS transistors. The selector 11 is provided to control signals RTG0 and RTG1 outputted from an address decoder 2f. A read address signal RA1 is supplied to the address decoder 2f.

In the multiport memory constructed as described above, the respective pairs of write word lines WW00-WW11 and WW10-WW11 do not intersect with each other and accordingly the order of the memory cells 1 is not changed. Therefore, two kinds of layouts of different topologies are required for the memory cells 1 and the write word lines WW00 to WW11.

Now, operation of the multiport memory shown in FIG. 1 will be described. The data $DI_0$ to $DI_3$ to be written are supplied to the write circuits 30 to 33 in the same manner as in the prior art. On the other hand, words to be written out of four words are designated by the write address signals WA0 and WA1. Write addresses are controlled to set the write word line WW00 or WW10 to "1" if the control signal WTG0 from the address decoder 2d is "1" and to set the write word line WW01 or WW11 to "1" if the control signal WTG1 is "1". According to the data $DI_0$ to $DI_3$ supplied to the write circuits 30 to 33, the selector 10 select the write bit lines WB00 or WB01, WB10 or WB11, WB20 or WB21, and WB30 or WB31. Consequently, a length of the write bit lines is a half of that in the prior art and thus a delay time for writing the data is shortened. Further, the write bit lines WB00 or WB01, WB10 or WB11, WB20 or WB21, and WB30 or WB31 not selected by the selector 10 are not enabled and accordingly consumption of electric power by charge and discharge of the write bit lines is reduced to a half of that in the prior art.

Figure 26:
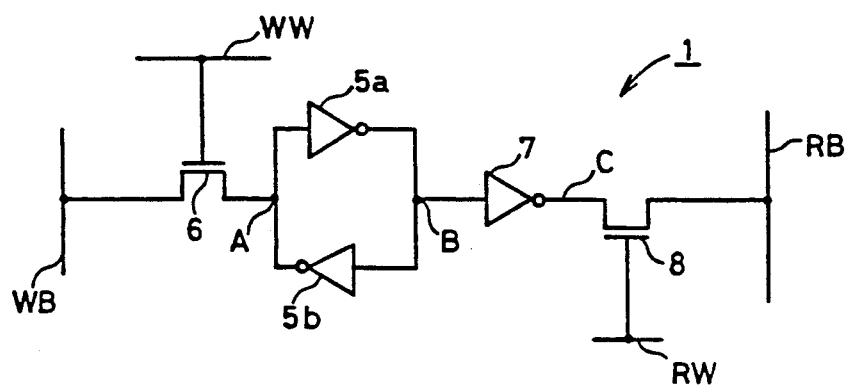
FIG. 26 is a concrete electric circuit diagram of a memory cell shown in FIG. 25.
Figure 27:
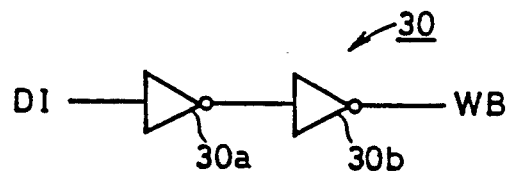
FIG. 27 is an electric circuit diagram of a write circuit shown in FIG. 25.
Figure 28:
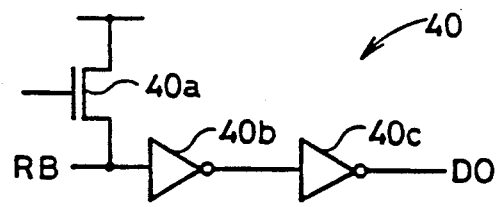
FIG. 28 is an electric circuit diagram of a sense amplifier shown in FIG. 25.
Figure 29:
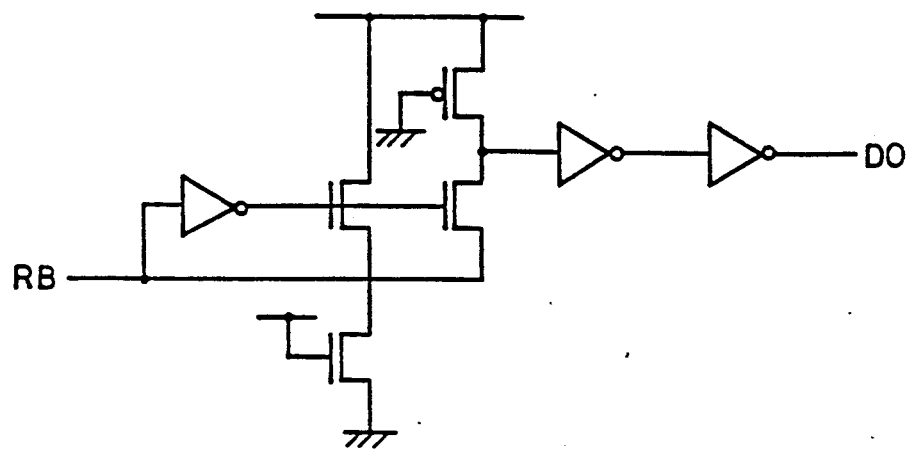
FIG. 29 is an electric circuit diagram showing another example of a sense amplifier.

The values of the write bit lines enabled as described above are transmitted to terminals A through access gates 6 of the memory cells 1, as shown in FIG. 26, connected to only one write word line set to "1" out of the write word lines WW00 to WW11. Since the sum of an output resistance obtained by composition of the on resistances of the corresponding MOS transistors of the write circuits 30 to 33 and the selector 10 and the on resistance of the corresponding access gate 6 is set smaller than the value of the output resistance of the corresponding inverter 5b, the value of the node A becomes equal to the value of the write bit line designated by the data, irrespective of the initial values of the nodes A and B, whereby the data is written.

In the memory cells 1 connected to the write word lines WW00 to WW11 set to "0", data are held and writing is not performed as in the prior art. Consequently, data are held in four memory cells 1 corresponding to a half of the total number of columns not selected by the write address signal WA1, although they are connected to the row selected by the write address signal WA0.

Figure 2:
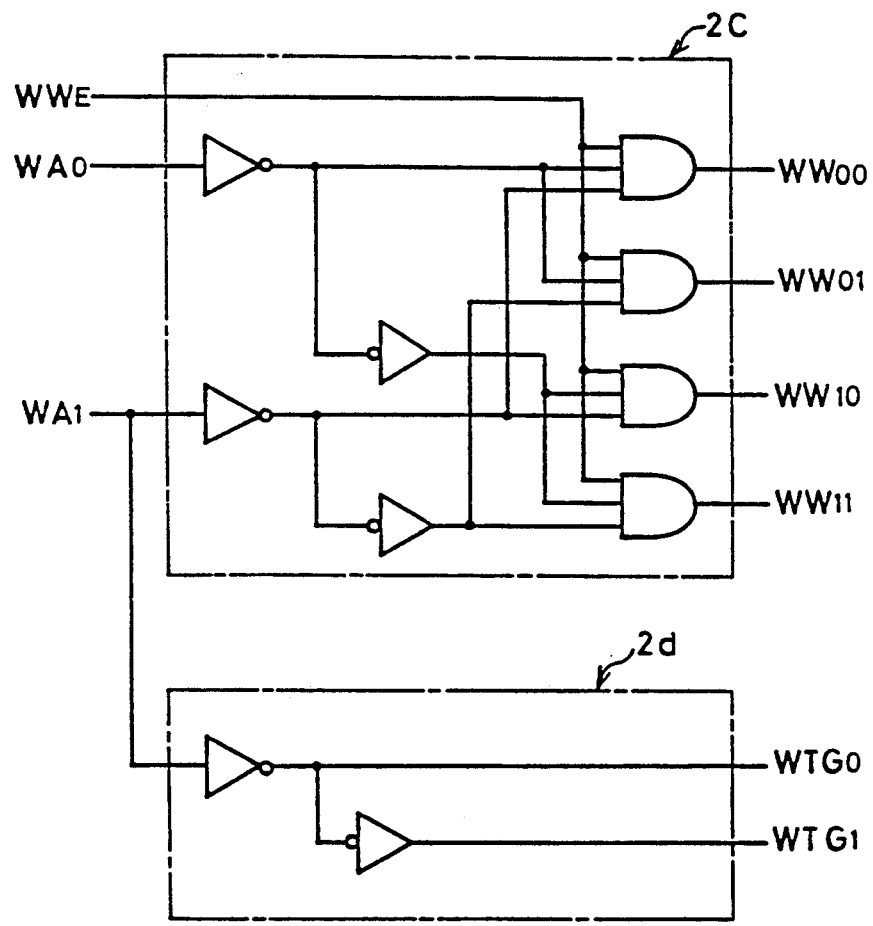
FIG. 2 is an electric circuit showing an example of an address decoder.

If the address decoder 2c is the one as shown in FIG. 2 provided with a write word line enable signal WWE, it functions as a normal decoder when the write word line enable signal WWE is "1". If the write word line enable signal WWE is "0", all the write word lines WW00 to WW11 are "0" and the data in all the memory cells 1 are held.

Next, read operation will be described. When a read address signal RA0 is supplied to the address decoder 2e, the address decoder 2e sets the read word line RW0X or RW1X to "1". As a result, a row corresponding to the read word line RW0X or RW1X is designated and two words out of four words are selected and, in the same manner as in the prior art, eight read bit lines RB00 to RB31 are set to the values of the terminals A of the corresponding memory cells 1 by means of the respective access gates 8 and inverters 7 of the corresponding memory cells 1.

When a read address signal RA1 is supplied to the address decoder 2f, the address decoder 2f sets the control signal RTG0 or RTG1 to "1". As a result, corresponding N channel MOS transistors of the selector 11 are enabled to select read bit lines RB00 or RB01, RB10 or RB11, RB20 or RB21, and RB30 or RB31, whereby the data are supplied to inputs of the sense amplifiers 40 to 43. In this case, the length of the read bit lines is a half of that in the prior art, making it possible to reduce a delay time in reading.

As described above, the data of the memory cells 1 of the words designated by the read address signals RA0 and RA1 are amplified by the sense amplifiers 40 to 43, so as to be outputted as the data DO₀ to DO₃.

It is not necessary to provide two read word lines RW for each row as in the case of the write word lines WW, because the values at the terminals A and B of each memory cell 1 are not inverted even if the read word line RW is changed to "1" as described previously in connection with the prior art.

As described above, according to this embodiment, a plurality of write word lines WW00 to WW11 are provided corresponding to the memory cells 1 of the respective rows of the memory cell array and each memory cell 1 is connected to only one of the write word lines WW00 and WW01 of the pair. Consequently, it becomes possible to freely set a proportion of the two dimensions of the layout of the the memory cell array and to decrease the number of rows. Further, it becomes possible to increase the number of columns for one bit and to easily design a layout of peripheral circuits such as the write circuits 30 to 33 and the sense amplifiers 40 to 43. In addition, the lengths of the write bit lines WB00 to WB31 and the read bit lines RB00 to RB31 can be shortened and delay time and consumption of electric power required for charge and discharge of those bit lines can be reduced.

Figure 3:
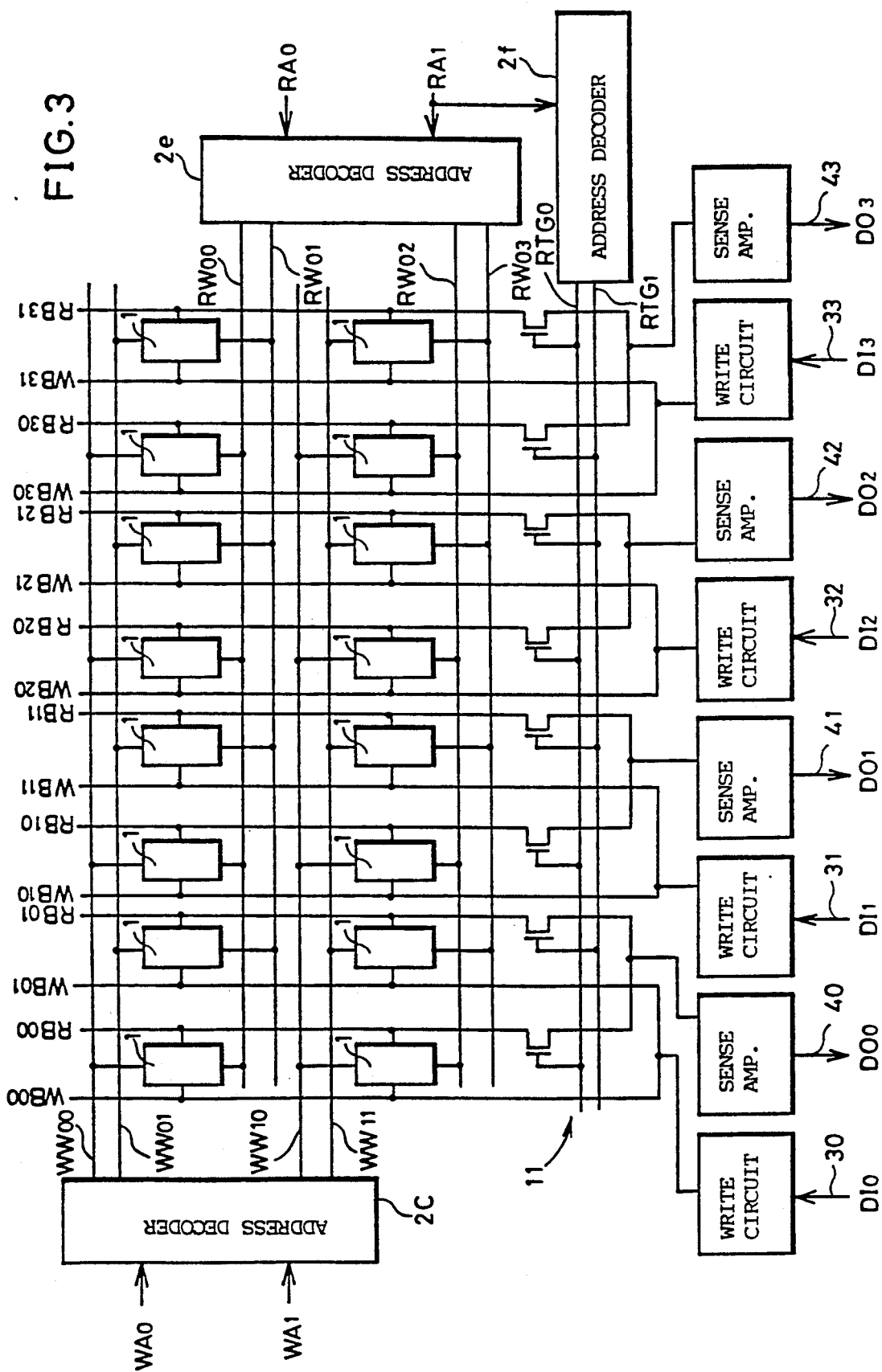
FIG. 3 is a block diagram of another embodiment of the present invention.

FIG. 3 is a block diagram showing another embodiment of the present invention. In the embodiment shown in FIG. 3, the address decoder 2d and the selector 10 as shown in FIG. 1 are not provided and the outputs of the write circuits 30 to 33 are directly connected to the write bit lines WB00-WB01, WB10-WB11, WB20-WB21 and WB30-WB31 and the address decoder 2e provides output to two read word lines for each row, RW00 and RW01, RW02 and RW03. In this embodiment, consumption of electric power due to charge and discharge of the read bit lines RB00 to RB31 is reduced to a half of that in the prior art although consumption of electric power in the write bit lines WB00 to WB31 is the same as in the prior art.

Figure 4:
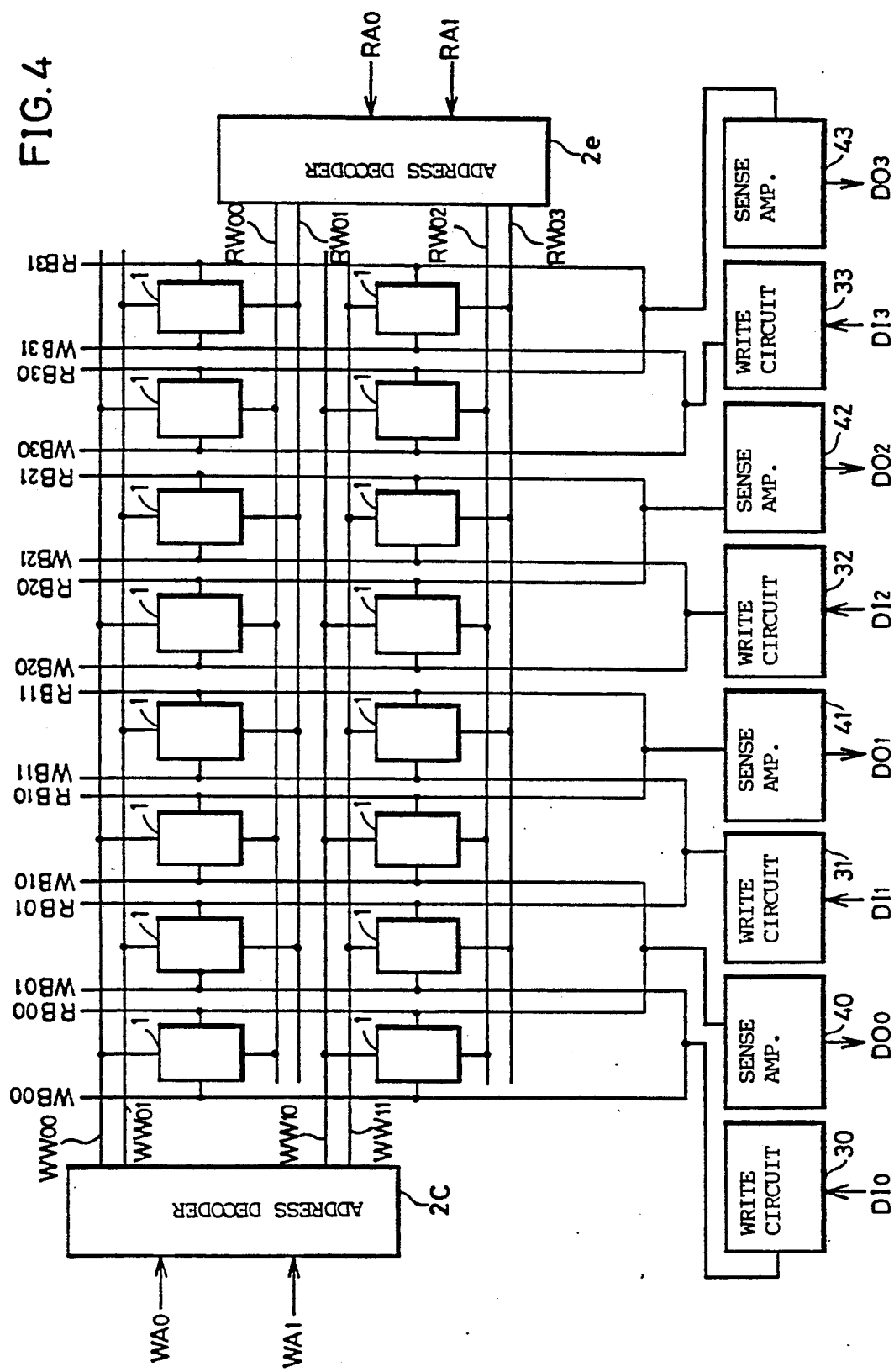
FIG. 4 is a block diagram of a further embodiment of the present invention.

FIG. 4 is a block diagram showing a further embodiment of the present invention. The embodiment shown in FIG. 4 is constructed by omitting the address decoder 2f and the selector 11 from the construction shown in FIG. 3. In this embodiment of FIG. 4, the write bit lines WB00-WB01, WB10-WB11, WB20-WB21, and WB30-WB31 are directly connected to the write circuits 30 to 33 and the read bit lines RB00-RB01, RB10-RB11, RB20-RB21, and RB30-RB31 are directly connected to the sense amplifiers 40 to 43, respectively.

Figure 5:
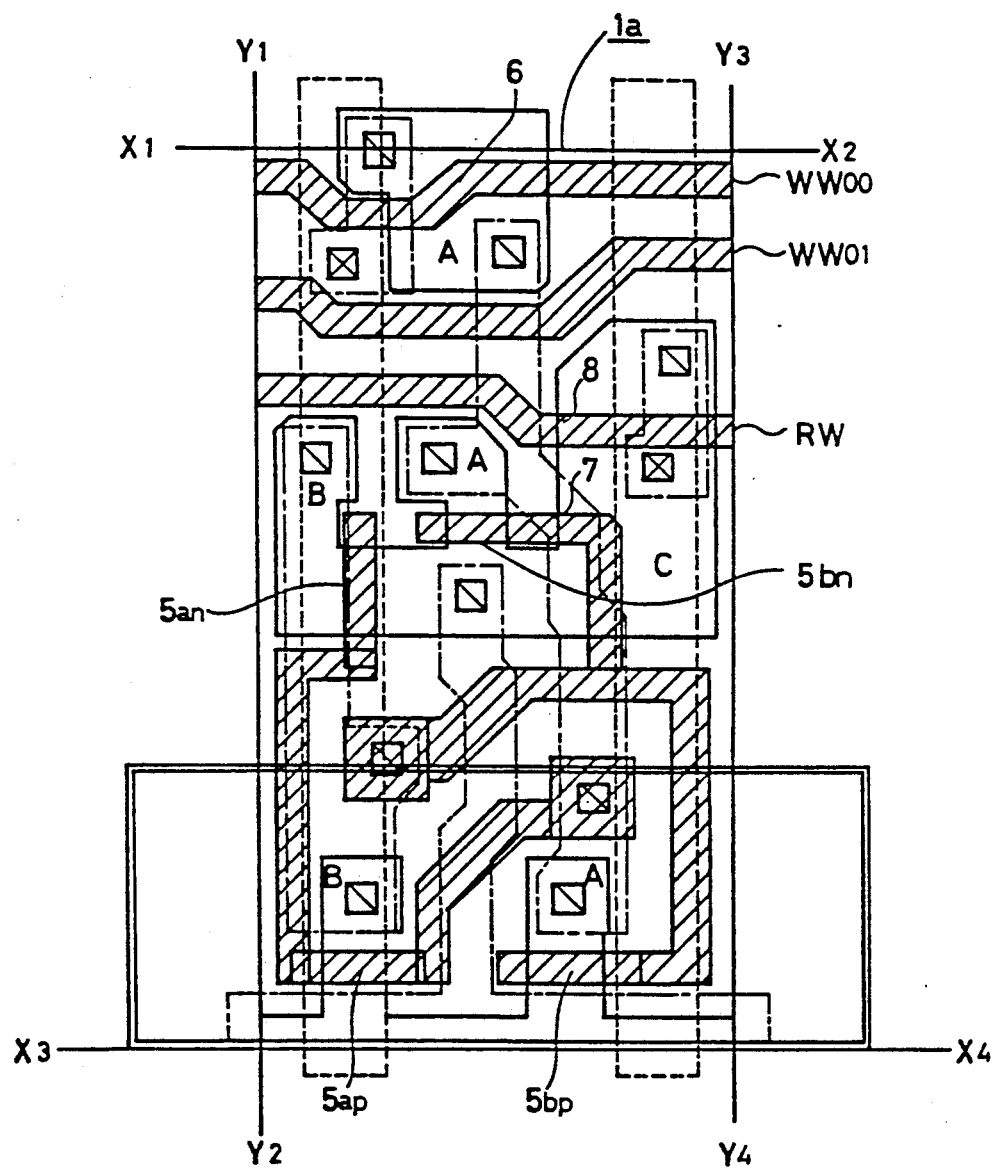
FIGS. 5 and 6 are schematic views showing layouts of memory cells used in a multiport memory shown in FIG. 1, 3, or 4.
Figure 6:
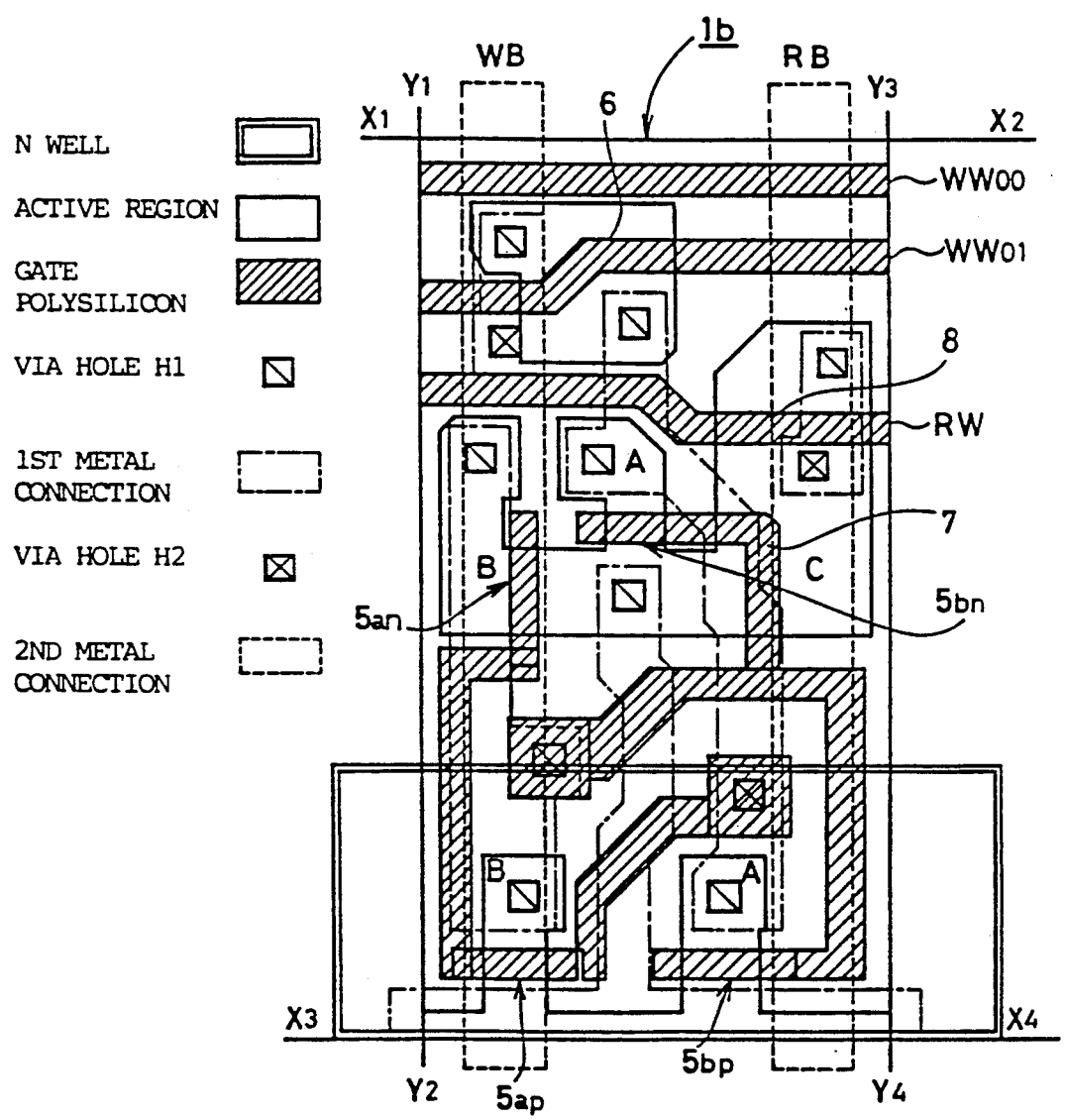

FIG. 5 is an illustration of layout of a memory cell 1a connected to the write word line WW00 shown in FIG. 1 and FIG. 6 is an illustration of layout of a memory cell 1b connected to the word line WW01 shown in FIG. 1.

Referring to FIGS. 5 and 6, the memory cells 1a and 1b are provided adjacent to each other in the row direction in a repeating manner with the lines Y1-Y2 and Y3-Y4 being overlapped with each other, and in the column direction in the repeating manner by reversing the figure with respect to the line X1-X2 or X3-X4. Each of the memory cells 1a and 1b shown in FIGS. 5 and 6 is formed by the above described circuit shown in FIG. 26. More specifically, it comprises N channel MOS transistors 6 and 8, an N channel MOS transistor 5a and a P channel MOS transistor 5ap constituting an inverter 5a, and an N channel MOS transistor 5b and a P channel MOS transistor 5bp constituting an inverter 5b. A via hole H1 connects a first metal connection to a gate polysilicon region or an active region and a via hole H2 connects a second metal connection to the first metal connection. An overlap of the active region and the gate polysilicon region is a channel of the MOS transistor. Channels formed in the N wells become the P channel MOS transistors 5ap and 5bp an channels formed in other regions than the N wells become the N channel MOS transistors 5an and 5bn.

Figure 7:
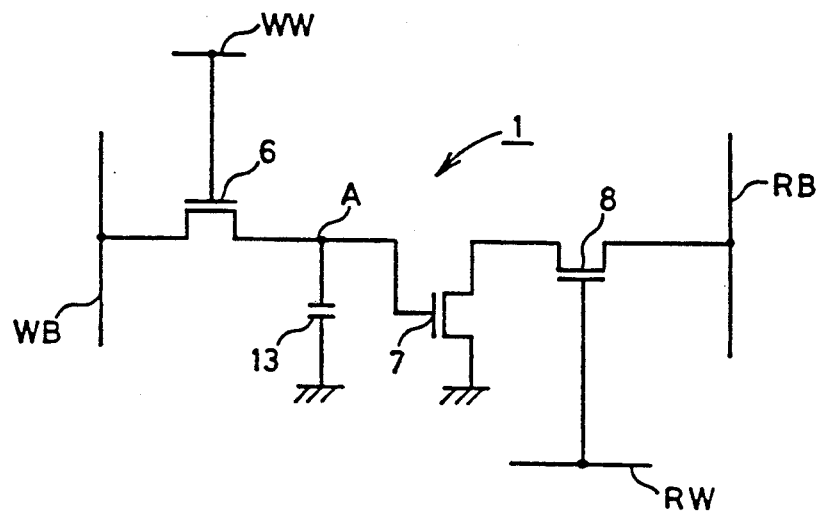
FIG. 7 is an electric circuit diagram of a memory cell used in a multiport memory of an embodiment of the present invention.

FIG. 7 is an electric circuit diagram showing another example of a memory cell according to the present invention.

The above described memory cell 1 shown in FIG. 26 comprises a flip-flop including two inverters 5a and 5b, while the memory cell shown in FIG. 7 is of a dynamic type which determines a value of data dependent on existence or non-existence of charge in a charge storage capacitance instead of using the flip-flop. In the memory cell shown in FIG. 7, data outputted to the read bit line RB is an inversion of a value previously written through the write bit line WB and accordingly it is necessary to invert again the data by the corresponding one of the write circuits 30 to 33 or the corresponding one of the sense amplifiers 40 to 43 shown in FIG. 1.

Figure 8:
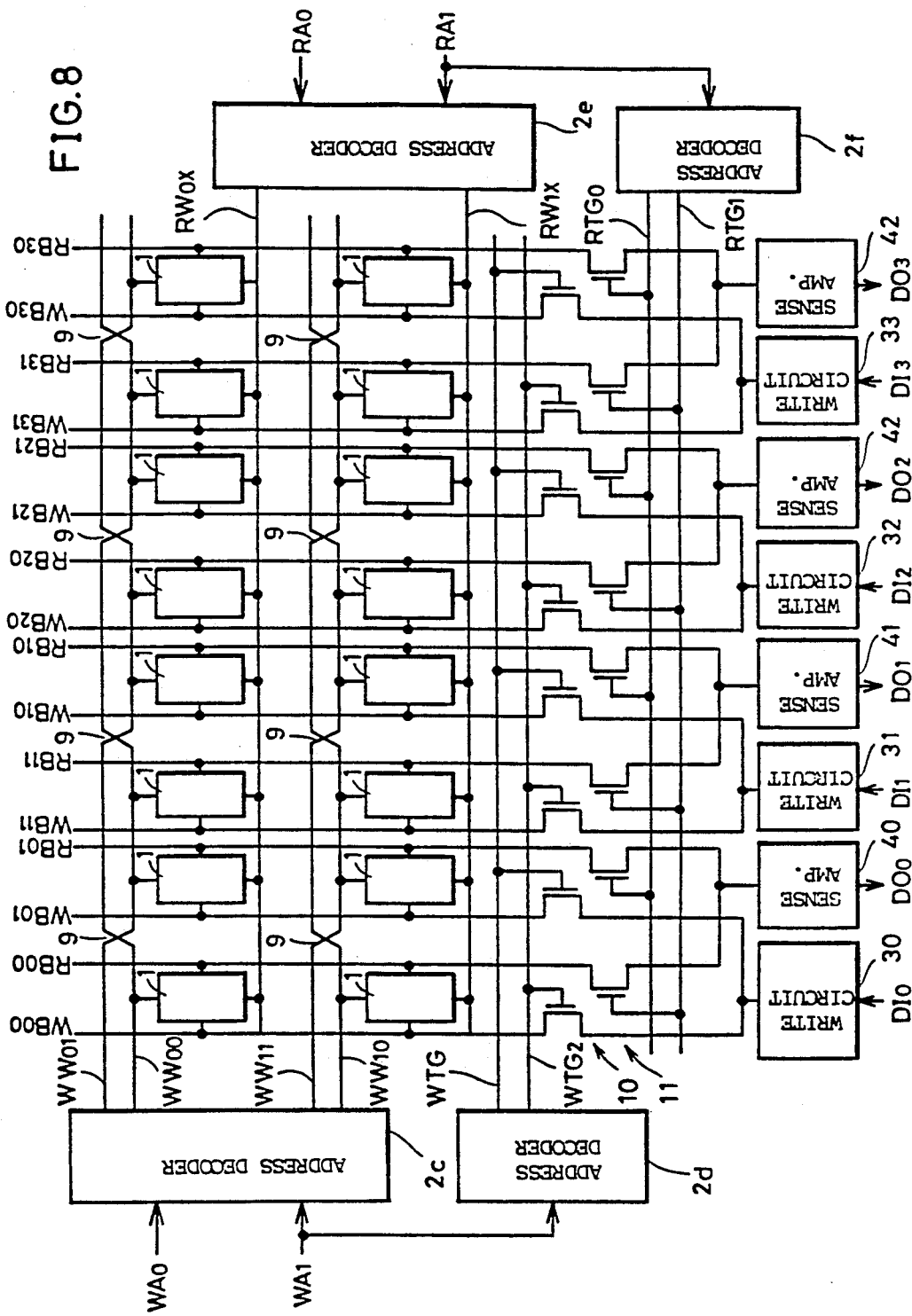
FIGS. 8, 9, 10 and 11 are concrete block diagrams showing further embodiments of the present invention.

FIG. 8 is a concrete block diagram showing a still further embodiment of the present invention.

In the multiport memory shown in FIG. 8, the write word lines WW00 and WW01 shown in FIG. 1 cross each other in a twist region 9 and the write word lines WW10 and WW11 also cross each other in the twist region 9. Other construction of this multiport memory is the same as in FIG. 1. Thus, since the write word lines WW002, WW11 are crossed in the twist region 9, the layout of each memory cell 1 and the write word lines WW00 to WW11 may be the same as described above or a layout having the same topology, irrespective of write word lines connected.

Write operation and read operation in the multiport memory shown in FIG. 8 are performed in the same manner as in the example shown in FIG. 1.

Figure 9:
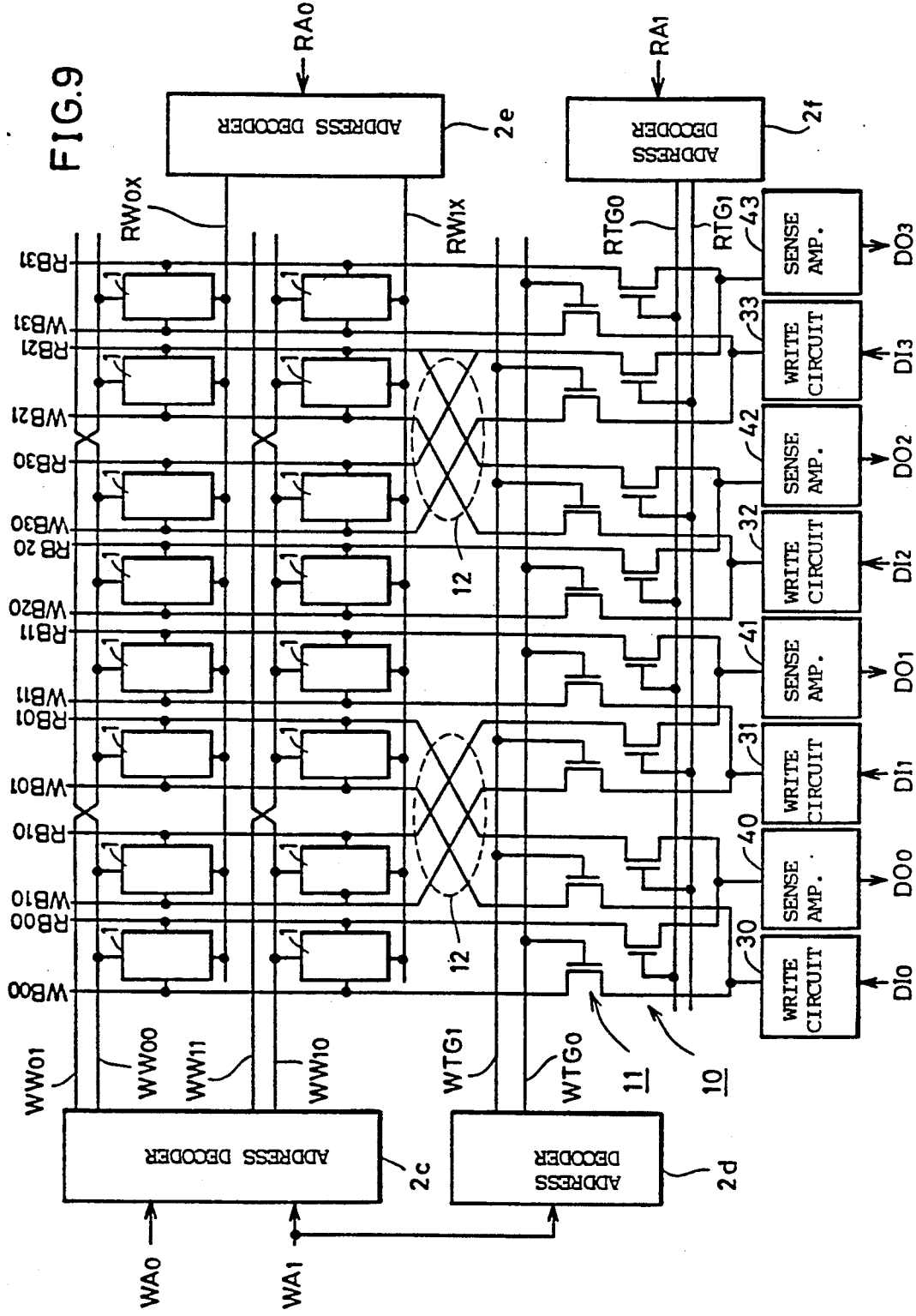

FIG. 9 is a block diagram showing a still further embodiment of the present invention.

In the above described the embodiment shown in FIG. 8, the write word lines WW00 to WW11 are crossed for one word. On the other hand, in the embodiment shown in FIG. 9, the write word lines WW00 to WW11 are crossed for every two words and those lines are twisted between the write circuits 30 to 33 and the sense amplifiers 40 to 43. Thus, the write word lines WW00 to WW11 are crossed for two words, whereby the area for arrangement of the memory cells can be further reduced.

Figure 10:
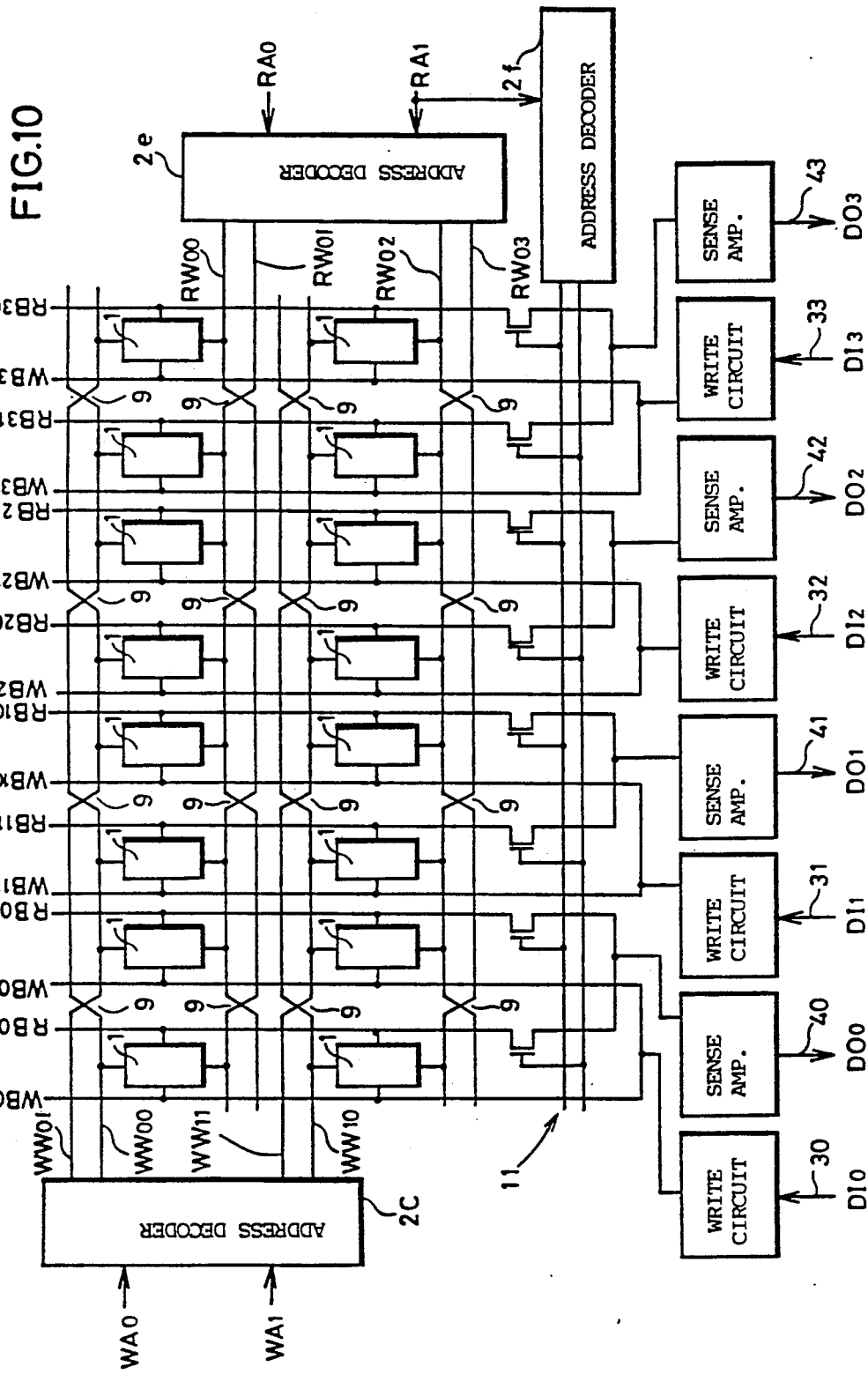

FIG. 10 is a block diagram showing a further embodiment of the present invention.

In the embodiment shown in FIG. 10, the write word lines WW00 to WW11 in the embodiment of FIG. 3 are crossed in the twist region 9 for every one word and the other construction is the same as in FIG. 3.

Figure 11:
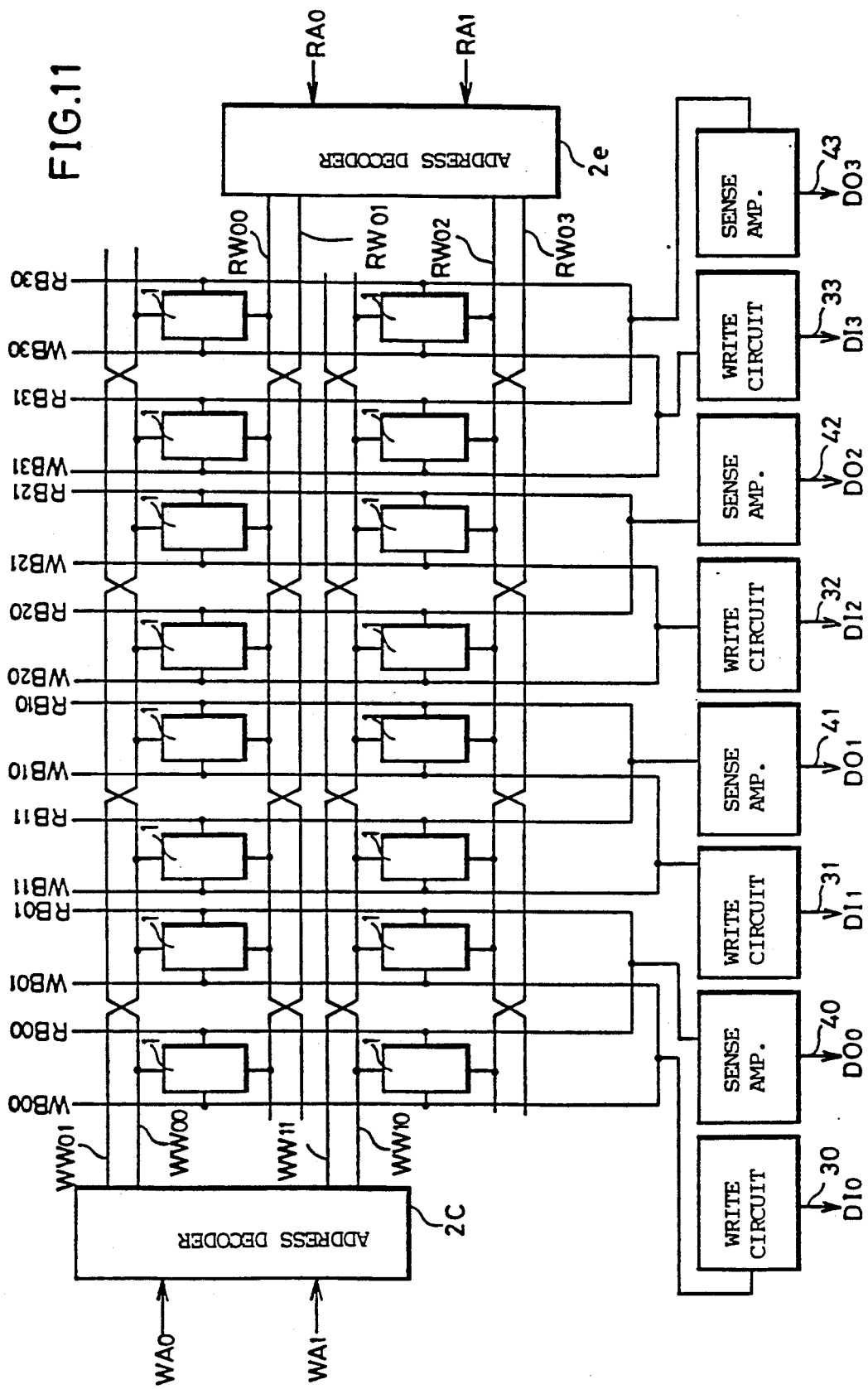

FIG. 11 is a block diagram showing a still further embodiment of the present invention.

In the embodiment shown in FIG. 11, the write word lines WW00 to WW11 in the embodiment shown in FIG. 4 are crossed for every one word in the twist region 9.

Figure 13:
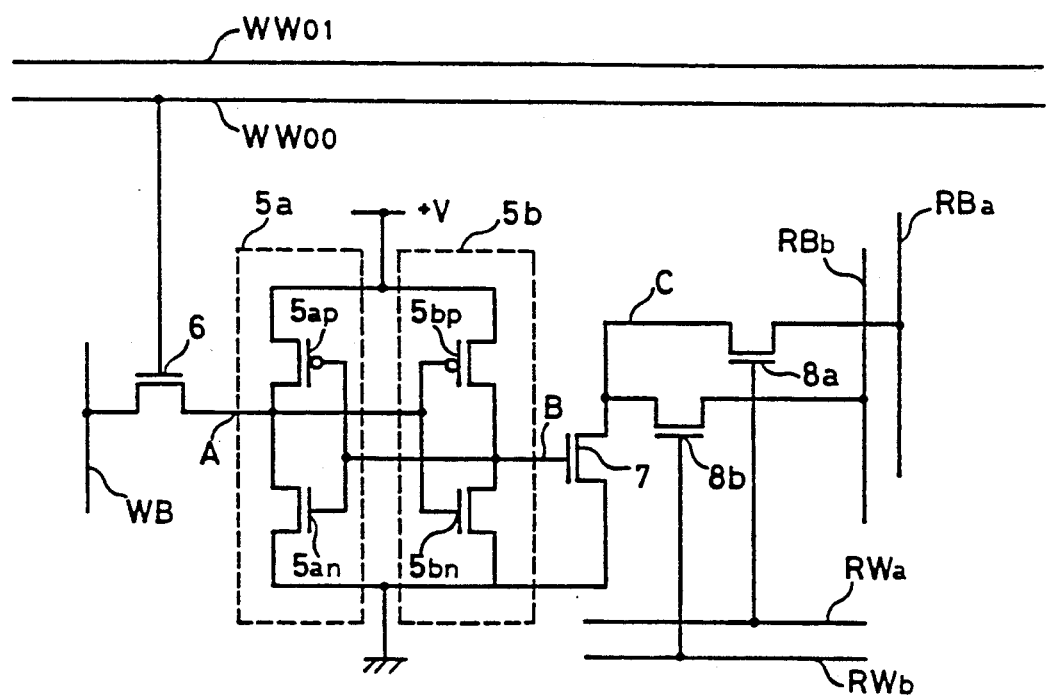
FIG. 13 is an electric circuit diagram showing another example of a memory cell.
Figure 12:
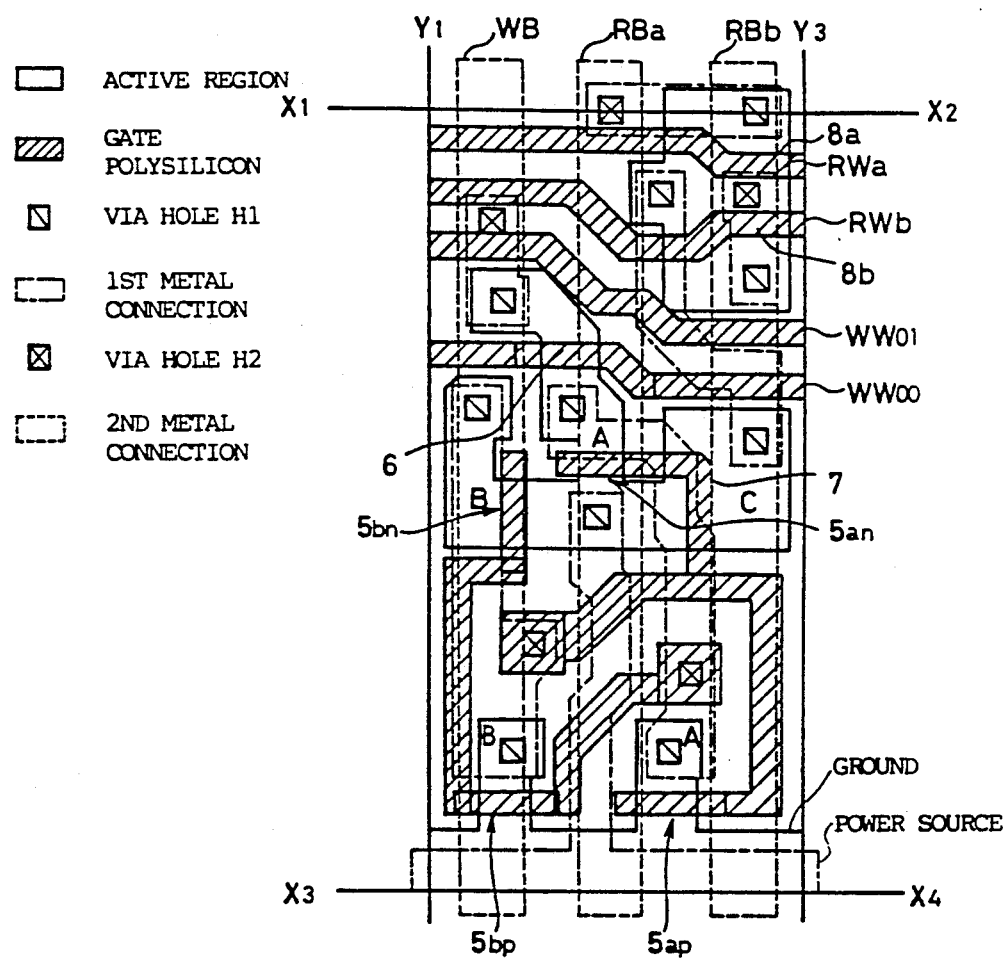
FIG. 12 is an illustration of a layout of memory cells in a further embodiment of the invention.

FIG. 12 is an illustration showing a layout of memory cells according to a still further embodiment of the present invention and FIG. 13 is an electric circuit diagram of the memory cells.

Each of the memory cells shown in FIGS. 12 and 13 is connected with one write word line WW00 and two read word lines RWa and RWb and it is constructed in the manner in which two N channel MOS transistors 8a and 8b are connected to an output of an inverter 7 formed by an N channel MOS transistor as shown in FIG. 13. More specifically, the N channel MOS transistors 8a and 8b have respective drains connected to the output of the inverter 7, respective gates connected to the read word lines RWa and RWb and respective sources connected to the read bit lines RBa and RBb. The layout of those memory cells are as shown in FIG. 12. More specifically, in the layout shown in FIG. 12, the two read word lines RWa and RWb are connected to the respective gates of the N channel MOS transistors 8a and 8b.

FIG. 14 is a block diagram showing a still further embodiment of the present invention.

In the embodiment shown in FIG. 14, adjacent memory cells 1 corresponding to different write word lines are connected to common write bit lines WB0 to WB3. More specifically, a memory cell connected to the write word line WW00 and a memory cell 1 adjacent to this memory cell and connected to the write word line WW01 are connected with the common write bit line WB0. The write bit lines WB0 to WB3 are connected to the write circuits 30 to 33, respectively. Other construction is the same as the above described embodiment of FIG. 1.

In the embodiment shown in FIG. 14, the address decoder 2c enables any of the write word lines WW00 to WW11 in response to the write address signal WA0 or WA1 and when the data $DI_0$ to $DI_3$ are supplied to the write circuits 30 to 33, the write circuits 30 to 33 output the data to the write bit lines WB0 to WB3, whereby the data are written in the corresponding memory cells 1. Bit operation in this embodiment is performed in the same manner as in the multiport memory shown in FIG. 1.

As described above, the write bit lines WB0 to WB3 are used in common, which makes it possible to decrease the number of bit lines and to reduce the area of the device.

FIG. 15 is a block diagram showing a still further embodiment of the present invention. In the embodiment of FIG. 15, adjacent memory cells 1 corresponding to different write word lines WW00 and WW01, WW10 and WW11 are connected with common write bit lines WB0 to WB3, which are connected to the write circuits 30 to 33, respectively. Other construction is the same as in the above described embodiment of FIG. 3.

Figure 16:
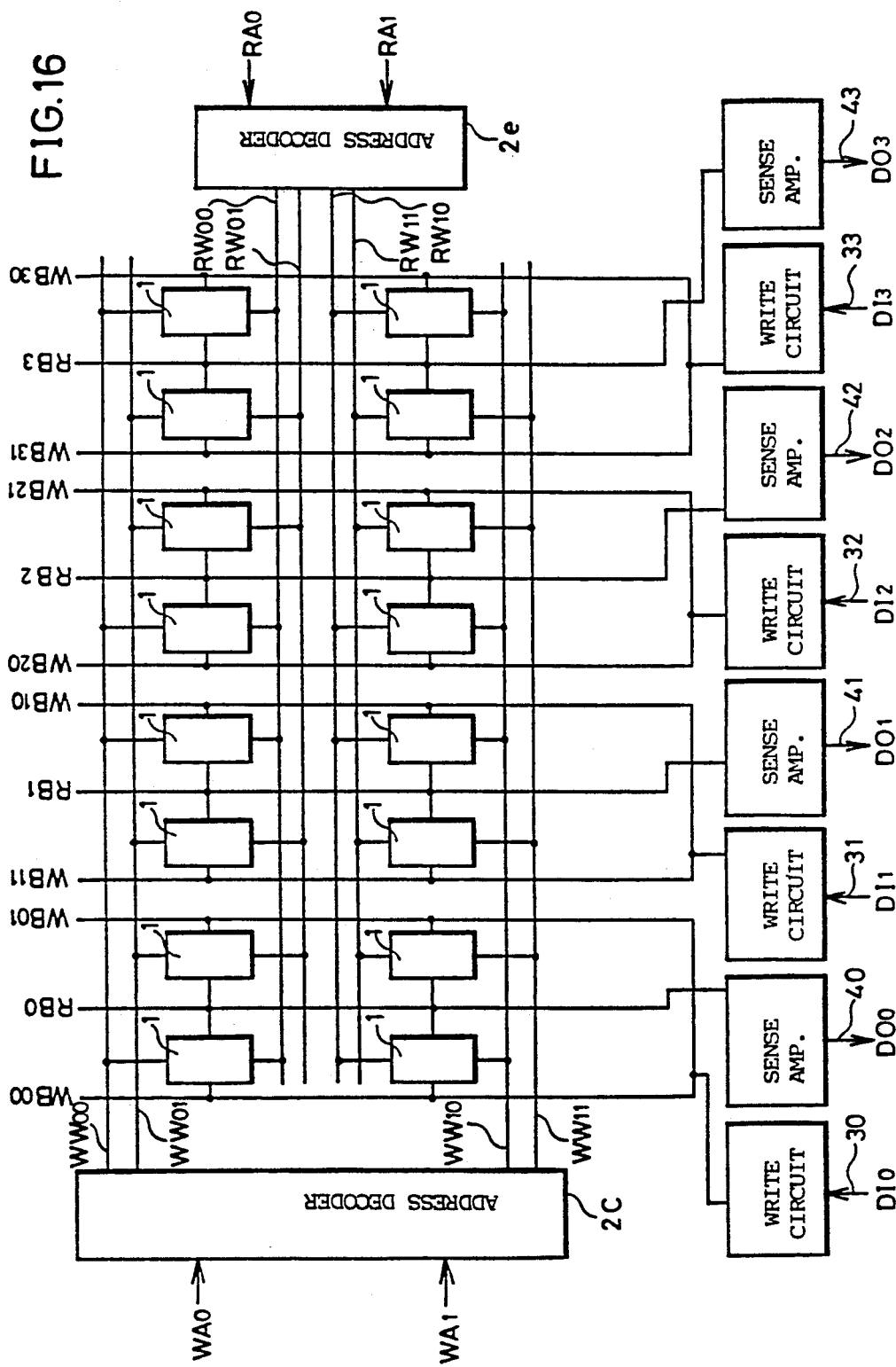

FIG. 16 is a block diagram showing a still further embodiment of the present invention. In the embodiment of FIG. 16, adjacent memory cells corresponding to different write word lines WW00 and WW01, and WW10 and WW11 are connected to common read bit lines RB0 to RB3, which are connected to the sense amplifiers 40 to 43, respectively. Other construction is the same as in the embodiment to of FIG. 4.

FIG. 17 is an illustration of layout of the memory cells for two bits shown in FIGS. 14 to 16.

The memory cells in FIG. 17 are arranged symmetrically with respect to a common write bit line WB0 at the center, with the respective memory cells 1 of FIG. 26 for two bits being provided on the left and on the right and connected to the common write bit line WB0. As is clear from FIG. 17, in the embodiments shown in FIGS. 15 and 16, the area of the device can be reduced since the write bit line WB0 is used in common.

The above described respective embodiments have the 4-word 4-bit configuration in which two ports as a write port and a read port are provided and two word lines are provided for one port of one row of the memory cell array. Those numerals can be generalized by using natural numbers i,j,k and m. More specifically, it is possible to use expressions as i words×j bits, and n word lines for k ports including at least one write port.

Figure 18:
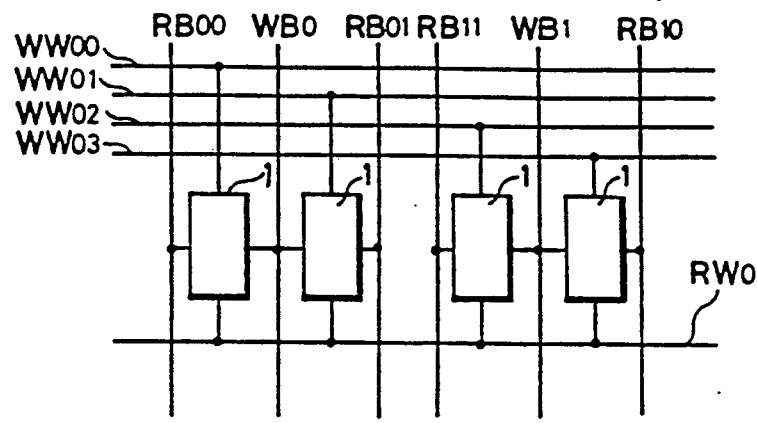
FIGS. 18 and 19 are connection diagrams of memory cells in further embodiments of the present invention.
Figure 19:
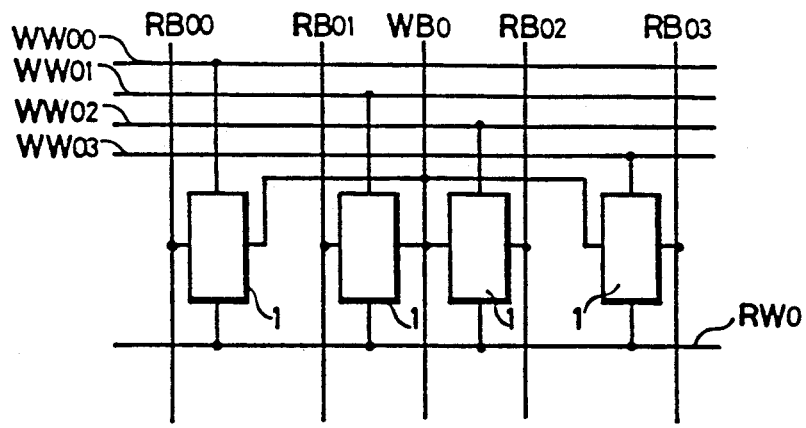

FIGS. 18 and 19 are block diagrams showing further embodiments of the invention.

FIG. 18 shows a part of a memory cell array in the case in which the above described number n is 4, that is, four word lines are provided as one set. The four memory cells 1 shown in FIGS. 18 and 19 are provided repeatedly to form a memory cell array. In the embodiment of FIG. 18, two memory cells 1 use in common one write bit line WB0 or WB1 and in the embodiment of FIG. 19, four memory cells 1 use in common one write bit line WB0.

Figure 20:
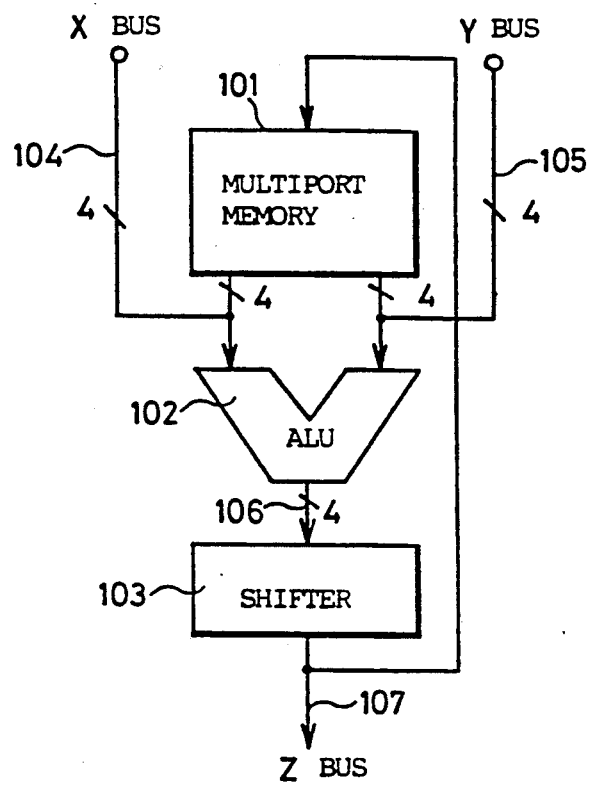
FIG. 20 is a schematic block diagram showing a data path of a microprocessor to which a multiport memory of an embodiment of the present invention is applied.

FIG. 20 is a schematic block diagram showing a data path of a microprocessor as an example of application of a multiport memory according to an embodiment of the present invention.

Referring to FIG. 20, the data path comprises a multiport memory 101, an arithmetic and logic unit (ALU) 102 and a shifter 103. Outputs of the multiport memory 101 and inputs of the ALU 102 are connected by 4-bit bidirectional buses and they are also connected to a 4-bit X bus 104 and a 4-bit Y bus 105. An output of the ALU 102 is connected to an input of the shifter 103 through a 4-bit bus 106 and an output of the shifter 103 is connected to an input of the multiport memory 101 and is connected to a Z bus 107.

In general, the ALU 102 and the shifter 103 require a dimension 50 to 100 times larger than that according to a manufacturing wafer process design rule for one bit, while a width of one column of a memory cell array only requires a dimension 15 to 30 times larger than that of the design rule. Accordingly, if the number of columns for one bit in the memory cell array is 2 to 4 in the latter case, the respective widths of the multiport memory 101, the ALU 102 and the shifter 103 corresponding to one bit can be made equal without leaving any unnecessary gaps.

Figure 21:
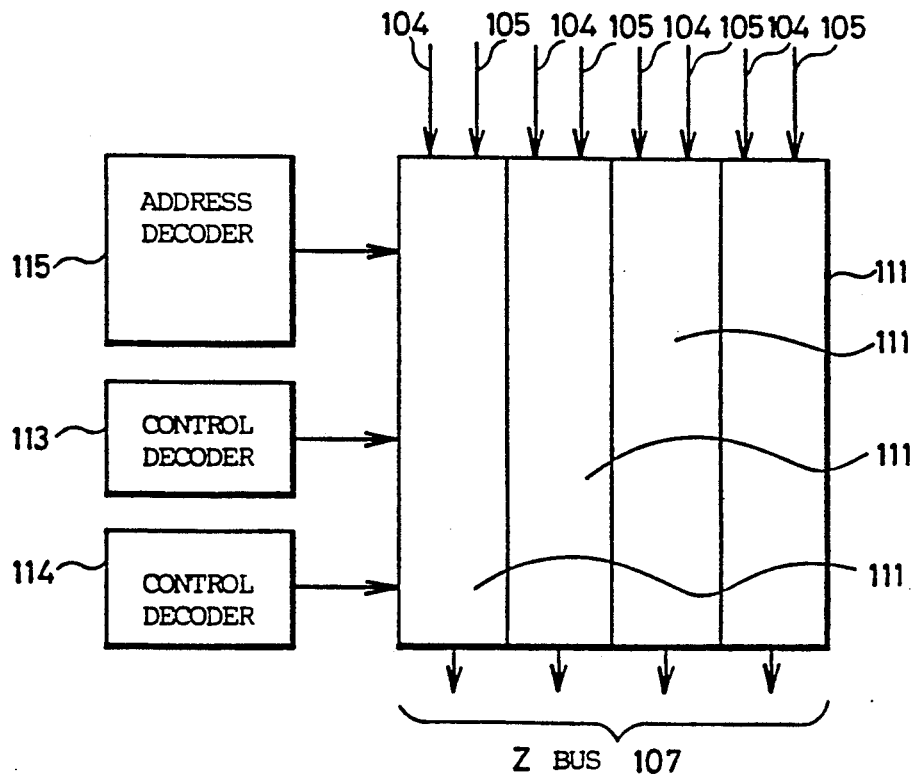
FIG. 21 is a schematic layout illustration of a 4-bit data path.

FIG. 21 is a schematic layout illustration of a 4-bit data path. In FIG. 21, the data path comprises an address decoder 115, control decoders 113 and 114, and a data portion. The data portion includes four sections 111 divided vertically corresponding to the respective bits. Each section 111 comprises a multiport memory 101, an ALU 102 and a shifter 103. An X bus 104 and a Y bus 105 are connected to an upper side of each section 111 and a Z bus 107 is connected to a lower side thereof.

Figure 22:
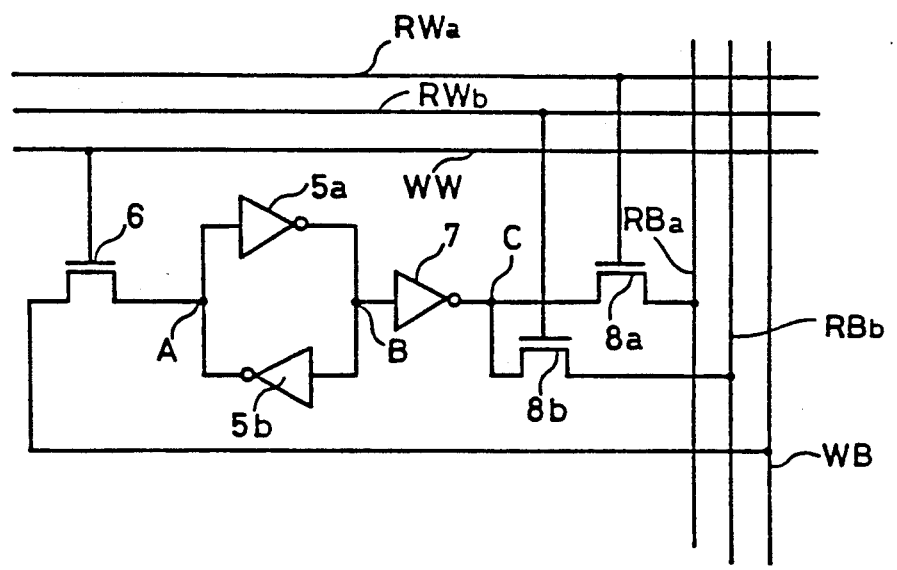
FIG. 22 is an electric circuit diagram of a memory cell of a multiport memory.
Figure 25:
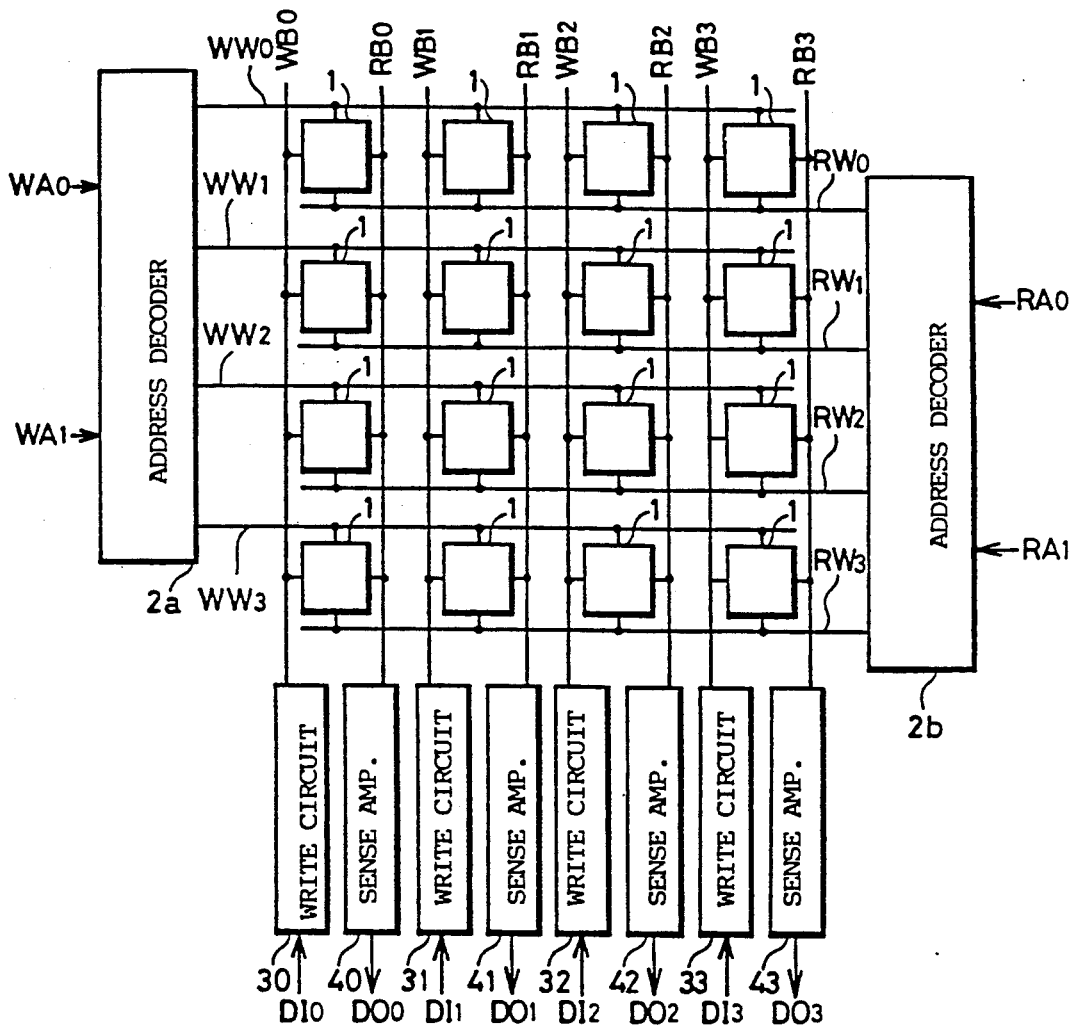
FIG. 25 is a block diagram showing a conventional multiport memory.

FIG. 22 is an electric circuit diagram of a memory cell used in the data path shown in FIG. 21. The memory cell of FIG. 22 is constructed in the same manner as in FIG. 13 and it comprises one write port and two read ports.

Figures 23, 24:
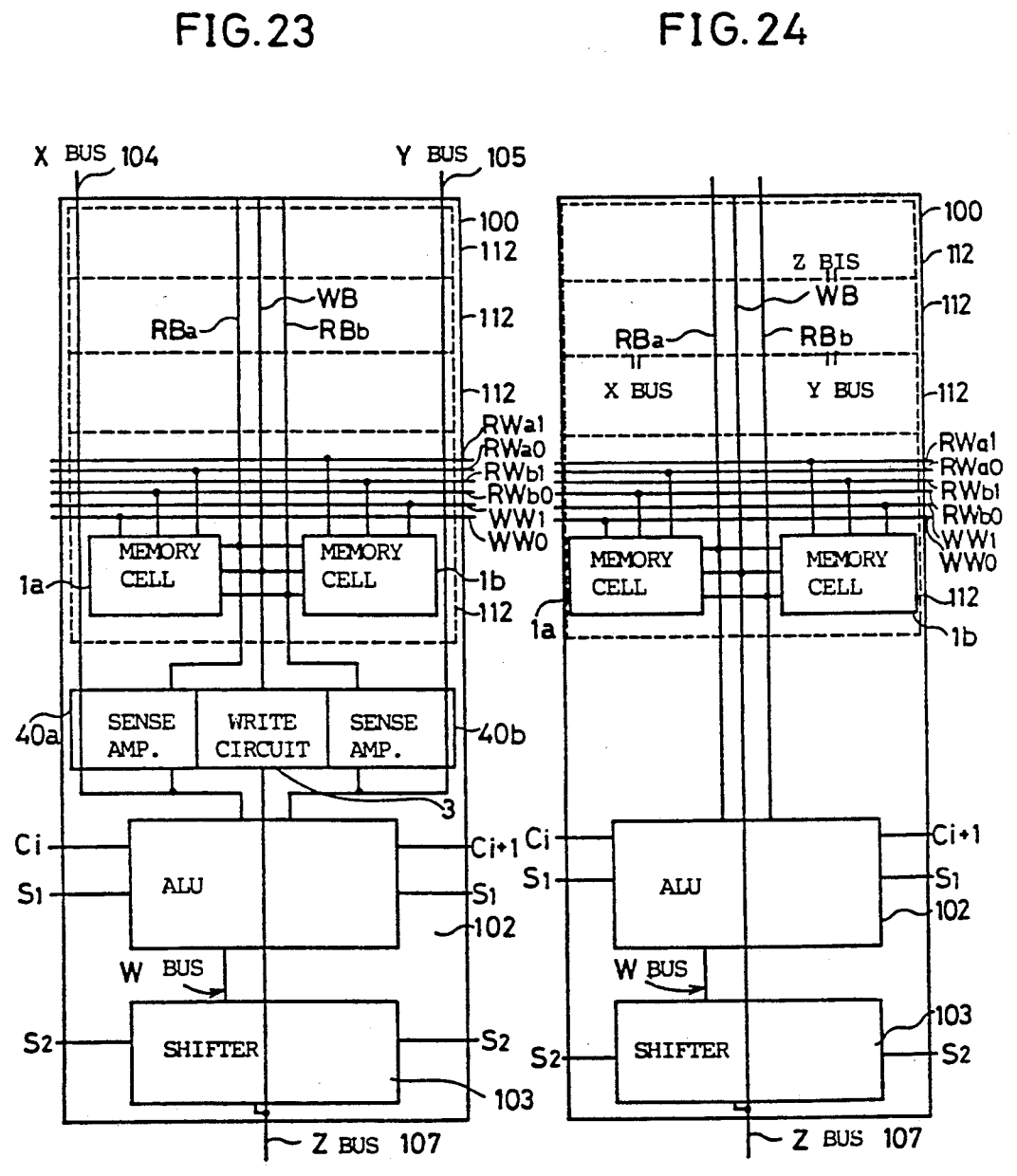

FIG. 23 is a diagram showing, in an enlarged manner, a data path of one bit shown in FIG. 21. Referring to FIG. 23, the data path 100 comprises an ALU 102 of a 1-bit width, a shifter 103 of a 1-bit width and a multiport memory 112 formed by 1 bit × 8 words. The multiport memory 112 comprises memory cells 1a and 1b, which are the memory cells as shown in FIG. 22. The memory cell 1a is connected with a write word line WW0 and read word lines RWa0 and RWb0, and a write bit line WB and read bit lines RBa and RBb. The memory cell 1b is connected with a write word line WW1, read word lines RWa1 and RWb1, a write bit line RW and read bit lines RBa and RBb. The write bit line WB is connected to the Z bus 107 through a write circuit 3. The read bit line RBa is connected to the X bus 104 through the sense amplifier 40a. The read bit line RBb is connected to the Y bus 105 through the sense amplifier 40b.

FIG. 24 is a block diagram showing another example of a data path of a 1-bit width.

The data path of FIG. 24 is constructed in the manner in which the sense amplifiers 40a and 40b and the write circuit 3 shown in FIG. 23 are omitted from the construction of FIG. 24. Thus, the write bit lines WB are directly connected to the Z bus 107 the read bit line RBa is connected to the X bus 104, and the read bit line RBb is directly connected to the Y bus 105.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of ports, comprising:
    a memory cell array in which a plurality of memory cells including data storage nodes are arranged in rows and in columns,
    write word lines and read word lines connected to the memory cells of the respective rows of said memory cell array,
    write bit lines and read bit lines connected to the memory cells of the respective columns of said memory cell array,
    input terminals to which data for enabling said write bit lines are inputted, and
    output terminals for outputting data read out from said memory cells, wherein
    any of said write bit lines is enabled according to the data supplied to the corresponding input terminal, electronic connection between said write bit line and the data storage node of the memory cell connected thereto is controlled in response to a signal outputted to the corresponding write word line, thereby to form a first port by said write bit line, said write word line and said input terminal, and
    any of said read word lines is enabled to cause the corresponding read bit line to be enabled by data corresponding to a value of the data storage node of the corresponding memory cell and the data according to a signal of the write bit line is outputted to the corresponding output terminal, thereby to form a second port by said read bit line, said read word line and said output terminal,
    the number of said write word lines provided is at least two for the memory cells of each row of said memory cell array and one of said write word lines is connected to one memory cell of two adjacent memory cells and every other memory cell thereafter of the same row and the other of said write word lines is connected to the other memory cell of said two adjacent memory cells and every other memory cell thereafter of the same row.

2. A semiconductor device in accordance with claim 1, wherein
    each of said memory cells of said memory cell array comprises elements for writing data supplied to the corresponding write bit line is response to a signal supplied to the corresponding write word line and reading said written data to the corresponding read bit line in response to a signal supplied to the corresponding read word line.

3. A semiconductor memory device in accordance with claim 1, further comprising:
    a write address decoder for receiving a write address signal and providing a signal to said write word lines based on said write address signal,
    a read address decoder for receiving a read address signal and providing a read word signal to said read word lines based on said read address signal, write means for enabling the corresponding write bit line connected to adjacent two memory cells of said memory cell array based on the data inputted to the corresponding input terminal, and sense amplifiers for providing the data read out to said read bit line to the corresponding output terminal.

4. A semiconductor memory device in accordance with claim 3, wherein said read word lines are connected in common to the memory cells of the same row out of said memory cell array, said semiconductor memory device further comprising a first switching element connected between said write means and the write bit lines connected to the respective adjacent two memory cells, a second switching element connected between said read bit lines connected to said adjacent two memory cells and said sense amplifiers, a second write address decoder for receiving said write address signal and switching said first switching element in response to said write address signal, and a second read address decoder for receiving said read address signal and switching said second switching element in response to said read address signal.

5. A semiconductor memory device in accordance with claim 3, wherein said read word lines include first read word lines each connected to one of the respective adjacent two memory cells of the same row and second read word lines each connected to the other one of said respective adjacent two memory cells, said read address decoder includes means for outputting the read word signal to said first and second read word lines, a switching element connected between said sense amplifiers and said read bit lines connected to said adjacent two memory cells, and a second read address decoder for receiving said read address signal and switching said switching element in response to said read address signal.

6. A semiconductor memory device in accordance with claim 3, wherein said read word lines include first read word lines each connected to one of respective adjacent two memory cells of the same row of said memory cell array and second read word lines each connected to the other one of said respective adjacent two memory cells.

7. A semiconductor memory device having a plurality of ports, comprising:

a memory cell array in which a plurality of memory cells including data storage nodes are arranged in rows and in columns, write word lines and read word lines connected to the memory cells of the respective rows of said memory cell array, write bit lines and read bit lines connected to the memory cells of the respective columns of said memory cell array, input terminals to which data for enabling said read bit lines are inputted, and output terminals for outputting data read out from said memory cell array, wherein the corresponding read bit line is enabled according to data supplied to any of said input terminals, electric connection between the corresponding write bit line and the data storage node of the memory cell connected to said write bit line is controlled in response to a write word signal outputted to the corresponding write word line, whereby a first port is formed by said write bit line, said write word line and said input terminal, the corresponding read word line is enabled to cause the corresponding read bit line to be enabled according to data corresponding to a value of the data storage node of the memory cell, data according to a signal of said read bit line is outputted to the corresponding output terminal, whereby a second port is formed by said read bit line, said read word line and said output terminal, said write word lines are provided as a plurality of pairs, each pair corresponding to a row of said memory cell array, the write word lines of each pair being provided to cross each other, and each memory cell within a corresponding row being connected to only one of the write word lines of the corresponding pair of write word lines.

8. A semiconductor memory device in accordance with claim 7, wherein each of said memory cells of said memory cell array comprises elements for writing data supplied to the corresponding write bit line in response to a write word signal supplied to the corresponding write word line and reading said written data to the corresponding read bit line in response to a read word signal supplied to the corresponding read word line.

9. A semiconductor memory device in accordance with claim 7, further comprising a write address decoder for receiving a write address signal and providing a write word signal to the corresponding write word line in response to said write address signal, a read address decoder for receiving a read address signal and providing a read word signal to the corresponding read word line in response to said read address signal, write means for enabling a write bit line connected to respective adjacent two memory cells of said memory cell array based on the data inputted to said input terminal, and sense amplifiers for outputting the data read out to said read bit line to the corresponding output terminal.

10. A semiconductor memory device in accordance with claim 9, wherein said read word lines are connected in common to the memory cells of the same row out of said memory cell array, said semiconductor memory device further comprising a first switching element connected between said write means and said write bit lines connected to said respective adjacent two memory cells, a second switching element connected between said sense amplifiers and said read bit lines connected to said respective adjacent two memory cells, a second write address decoder for receiving said write address signal and switching said first switching element in response to said write address signal, and a second read address decoder for receiving said read address signal and switching said second switching element in response to said read address signal.

11. A semiconductor memory device in accordance with claim 10, wherein
said write bit lines and said read bit lines are provided to cross respectively for a predetermined number of memory cells.

12. A semiconductor memory device in accordance with claim 9, wherein
said read word lines include first read word lines and second read word lines provided to cross respectively for a predetermined number of memory cells,
said read address decoder comprises means for outputting said read word signal to said first and second read word lines, said semiconductor memory device further comprising
a switching element connected between said sense amplifiers and said bit lines connected to said respective adjacent two memory cells, and
a second read address decoder for receiving said read address signal and switching said switching element in response to said read address signal.

13. A semiconductor memory device in accordance with claim 9, wherein
said read word lines include first read word lines and second read word lines provided to cross respectively for a predetermined number of memory cells.

14. A multiple-port semiconductor memory device having at least a write-port, comprising:
a memory cell array in which a plurality of memory cells having data storage nodes and each storing data on one bit are arranged in rows and in columns,
word lines connected to the memory cells of the respective rows of said memory cell array, and
bit lines connected to the memory cells of the respective columns of said memory cell array,
electric connection between the data storage nodes of said memory cells and said bit lines being controlled in response to a signal supplied to said word lines, wherein
said word lines of said write-port are provided as a group of write word lines and read word lines for each memory cell, said electric connection in each memory cell is controlled by a signal on one of the write word lines of the corresponding group, and adjacent memory cells of the same row are controlled by a different write word line, of the corresponding group.

15. A semiconductor memory device in accordance with claim 14, wherein
each of said memory cells of said memory cell array comprises elements for writing data supplied to the corresponding write bit line in response to the signal supplied to the corresponding write word line and reading said written data to the corresponding read bit line in response to the signal supplied to the corresponding read word line.

16. A semiconductor memory device comprising:
a memory cell array in which a plurality of memory cells having data storage nodes and each storing data on one bit are arranged in rows and in columns,
word lines connected to the memory cells of the respective rows of said memory cell array, and
bit lines connected to the memory cells of the respective columns of said memory cell array,
electric connection between the data storage nodes of said memory cells and said bit lines being controlled in response to a signal supplied to said word lines, wherein
said word lines are provided as a group of word lines for each memory cell, said electric connection in each memory cell is controlled by a signal on one of the word lines of the corresponding group, and adjacent memory cells of the same row are controlled by a different word line, respectively, of the corresponding group; wherein
said word lines include first word lines each connected to
said word lines include first word lines each connected to one of respective adjacent two memory cells of the same row of said memory cell array, and second write word lines each connected to the other one of said respective adjacent two memory cells, and
said bit lines include write bit lines and read bit lines connected in common to the memory cells of the same column of said memory cell array, said semiconductor memory device further comprising
a write address decoder for receiving a write address signal and providing a signal to said first and second write word lines based on said write address signal,
write means for enabling said write bit lines based on data inputted thereto, and
sense amplifiers for outputting data read out to said read bit lines.

17. A semiconductor memory device in accordance with claim 16, wherein
said word lines include read word lines connected in common to the memory cells of the same row of said memory cell array, said semiconductor memory device further comprising
a first read address decoder for receiving a read address signal and providing a read word signal to the corresponding read word line based on said read address signal,
a switching element connected between said sense amplifiers and said read bit lines connected to said respective adjacent two memory cells, and
a second read address decoder for receiving said read address signal and supplying a signal to said switching element to perform switching.

18. A semiconductor memory device comprising:
a memory cell array in which a plurality of memory cells having data storage nodes and each storing data on one bit are arranged in rows and in columns,
word lines connected to the memory cells of the respective rows of said memory cell array, and
bit lines connected to the memory cells of the respective columns of said memory cell array,
electric connection between the data storage nodes of said memory cells and said bit lines being controlled in response to a signal supplied to said word lines, wherein
said word lines are provided as a group of word lines for each memory cell, said electric connection in each memory cell is controlled by a signal on one of the word lines of the corresponding group, and adjacent memory cells of the same row are controlled by a different word line, respectively, of the corresponding group, and further wherein at least some of said memory cells are arranged on a common side of both or all word lines of a group of said word lines.

19. An i-bit data path formed by 1-bit data path sections, arranged in one direction and having substantially same function and layout, the number of said 1-bit data paths being i (i≧2), each said 1-bit data path section including a RAM of a 1-bit n-word configuration (n≧2) having at least first and second ports, said RAM including a memory cell array where memory cells including storage nodes are arranged in k rows and l columns (k≧1, l≧2, k·l=n), said memory cell array together with another memory cell array in another RAM of a 1-bit n-word configuration included in another 1-bit data path section constituting a larger memory cell array of k rows and i·l columns;

said data path comprising:

write word lines (WW0, WW1) and read word lines, and write bit lines and read bit lines, said write word lines and said write bit lines constituting a first port, input data being transmitted to the storage node of the memory cell of any one of n words through the write bit lines by conduction control responsive to a signal on the write word lines, said read word lines and said read bit lines constituting a second port, data of the storage node of the memory cell of any one of the n words being read through a transmission path of the memory cell and the read bit lines by conduction control responsive to a signal on the read word lines, each said 1-bit data path section including a 1-bit arithmetic logic unit (ALU) having an input to which data read from the RAM of the 1-bit n-word configuration is transmitted, said i-bit data path comprising a RAM of an i-bit n-word configuration formed by i RAMs of the 1-bit n-word configuration, and an i-bit ALU formed by i 1-bit ALUs.

20. A semiconductor memory device comprising:

a memory cell array in which a plurality of memory cells having data storage nodes and each storing data on one bit are arranged in rows and in columns;

word lines connected to the memory cells of the respective rows of said memory cell array;

bit lines connected to the memory cells of the respective columns of said memory cell array;

electric connection between the data storage nodes of said memory cells and said bit lines being controlled in response to a signal supplied to said word lines, wherein said word lines are provided as a group of write word lines and read word lines for each memory cell, said electric connection in each memory cell is controlled by a signal on one of the write word lines of the corresponding group, and adjacent memory cells of the same row are controlled by a different write word line, of the corresponding group, and said bit lines include write bit lines and read bit lines connected in common to the memory cells of the same column of said memory cell array;

a write address decoder for receiving a write address signal and providing a signal to said first and second write word lines based on said write address signal;

write means for enabling said write bit lines based on data inputted thereto;

sense amplifiers for outputting data read out to said read bit lines, wherein said word lines include first read word lines each connected to one of respective adjacent two memory cells of the same row of said memory cell array and second read word lines each connected to the other one of said respective adjacent two memory cells;

a first read address decoder for receiving a read address signal and providing a read word signal to said first and second read word lines;

a switching element connected between said sense amplifiers and said read bit lines connected to said respective adjacent two memory cells, and a second read address decoder for receiving said read address signal and supplying a signal to said switching element to perform switching.

21. A semiconductor memory device comprising:

a memory cell array in which a plurality of memory cells having data storage nodes and each storing data on one bit are arranged in rows and in columns;

word lines connected to the memory cells of the respective rows of said memory cell array;

bit lines connected to the memory cells of the respective columns of said memory cell array;

electric connection between the data storage nodes of said memory cells and said bit lines being controlled in response to a signal supplied to said word lines, wherein said word lines are provided as a group of write word lines and read word lines for each memory cell, said electric connection in each memory cell is controlled by a signal on one of the write word lines of the corresponding group, and adjacent memory cells of the same row are controlled by a different write word line, of the corresponding group, and said bit lines include write bit lines and read bit lines connected in common to the memory cells of the same column of said memory cell array;

a write address decoder for receiving a write address signal and providing a signal to said first and second write word lines based on said write address signal;

write means for enabling said write bit lines based on data inputted thereto;

sense amplifiers for outputting data read out to said read bit lines, wherein said word lines include first read word lines each connected to one of respective adjacent two memory cells of the same row of said memory cell array and second read word lines each connected to the other one of said respective adjacent two memory cells; and a read address decoder for receiving a read address signal and providing a red word signal to said first and second read word lines based on said read address signal.

* * * * *